(12) United States Patent
Liao et al.

(10) Patent No.: US 12,279,491 B2
(45) Date of Patent: Apr. 15, 2025

(54) DISPLAY PANEL AND DISPLAY DEVICE

(71) Applicants: Chengdu BOE Optoelectronics Technology Co., Ltd., Chengdu (CN); BOE TECHNOLOGY GROUP CO., LTD., Beijing (CN)

(72) Inventors: Maoying Liao, Beijing (CN); Huijuan Yang, Beijing (CN); Jie Dai, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 473 days.

(21) Appl. No.: 17/638,820

(22) PCT Filed: Jan. 28, 2021

(86) PCT No.: PCT/CN2021/074261
§ 371 (c)(1),
(2) Date: Feb. 26, 2022

(87) PCT Pub. No.: WO2022/160221
PCT Pub. Date: Aug. 4, 2022

(65) Prior Publication Data
US 2023/0165078 A1    May 25, 2023

(51) Int. Cl.
*H10K 59/131*    (2023.01)
*H10K 59/121*    (2023.01)
*H10K 77/10*    (2023.01)

(52) U.S. Cl.
CPC ....... *H10K 59/131* (2023.02); *H10K 59/1213* (2023.02)

(58) Field of Classification Search
CPC ............. H10K 59/123; H10K 59/1213; H10K 59/131; H10K 59/1315; H10K 50/805
See application file for complete search history.

(56) References Cited

U.S. PATENT DOCUMENTS

2021/0083033 A1* 3/2021 Bang ...................... H10K 59/40

\* cited by examiner

*Primary Examiner* — Sonya McCall-Shepard
(74) *Attorney, Agent, or Firm* — Perilla Knox & Hildebrandt LLP; Kenneth A. Knox

(57) ABSTRACT

A display panel and a display device are provided. The display panel includes a base substrate, a third conductive layer, a fourth conductive layer, a fifth conductive layer stacked in sequence. The third conductive layer includes first signal lines extending in a first direction and spaced apart in a second direction. The fourth conductive layer includes second signal lines extending in the first direction and spaced apart in the second direction. The second signal line includes second signal line segments spaced apart in the first direction. Each second signal line segment is electrically connected to a corresponding first signal line through a via hole. The fifth conductive layer includes electrode parts, the orthographic projections of at least some of the electrode parts on the base substrate are located in a gap between the orthographic projections of adjacent two second signal line segments in the same second signal line.

18 Claims, 19 Drawing Sheets

DISPLAY PANEL AND DISPLAY DEVICE

CROSS-REFERENCE TO RELATED APPLICATIONS

The present disclosure is a national phase application under 35 U.S.C. § 371 of International Patent Application No. PCT/CN2021/074261 filed on Jan. 28, 2021, the disclosure of which is incorporated by reference in its entirety herein.

TECHNICAL FIELD

The present disclosure relates to the field of display technology and, in particular, to a display panel and a display device.

BACKGROUND

In the related art, a display panel can transmit a same signal through two layers of signal lines to reduce signal attenuation on the signal lines. For example, the display panel can transmit a power signal through two layers of power lines.

It should be noted that the information disclosed in the background section above is only used to enhance the understanding of the background of the present disclosure, and may include information that does not constitute the related art known to those ordinary skilled in the art.

SUMMARY

According to an aspect of the present disclosure, a display panel is provided. The display panel includes: a base substrate, a third conductive layer, a fourth conductive layer and a fifth conductive layer. The third conductive layer is arranged on a side of the base substrate, and includes a plurality of first signal lines, orthographic projections of the plurality of first signal lines on the base substrate extend in a first direction and are spaced apart in a second direction, the first direction intersects with the second direction. The fourth conductive layer is arranged on a side of the third conductive layer away from the base substrate, and the fourth conductive layer includes a plurality of second signal lines, orthographic projections of the plurality of the second signal lines on the base substrate extend in the first direction and are spaced apart in the second direction; the plurality of the second signal lines are arranged in a one-to-one correspondence with the plurality of the first signal lines, each of the second signal lines includes a plurality of second signal line segments, and orthographic projections, on the base substrate, of the plurality of the second signal lines belonging to the same second signal line are spaced apart in the first direction, and the orthographic projection of the second signal line segment on the base substrate extends in the first direction; the orthographic projection of each of the second signal line segments on the base substrate at least partially overlaps with the orthographic projection of a corresponding first signal line on the base substrate, and each of the second signal line segments and the corresponding first signal line are electrically connected through a via hole. The fifth conductive layer is arranged on a side of the fourth conductive layer away from the base substrate, and the fifth conductive layer includes a plurality of electrode parts, the electrode part is configured to form an electrode of a light emitting unit. Orthographic projections, on the base substrate, of at least some electrode parts among the plurality of electrode parts are partially located in a gap between the orthographic projections, on the base substrate, of adjacent two second signal line segments in the same second signal line.

In an exemplary embodiment of the present disclosure, the first signal lines and the second signal lines are configured to provide power signals.

In an exemplary embodiment of the present disclosure, at least some of adjacent two first signal lines are electrically connected.

In an exemplary embodiment of the present disclosure, the fourth conductive layer further includes: a plurality of third signal lines, an orthographic projection of the third signal line on the base substrate is located between the orthographic projections of adjacent two second signal lines on the base substrate; the fifth conductive layer further includes a connection part, and the connection part is configured to connect adjacent two second signal lines through a via hole respectively, so as to connect adjacent two first signal lines.

In an exemplary embodiment of the present disclosure, the first direction is a column direction, and the second direction is a row direction the plurality of electrode parts include R-electrode parts, G-electrode parts, and B-electrode parts, the R-electrode parts, G-electrode parts, and B-electrode parts are alternately distributed in sequence along the same electrode row; in the same electrode row, two G-electrode parts distributed along the column direction are arranged between the R-electrode part and the B-electrode part; in adjacent two electrode rows, the electrode parts for the same color are arranged in different columns; in two electrode rows separated by one electrode row, the electrode parts for the same color are arranged in the same column.

In an exemplary embodiment of the present disclosure, the plurality of second signal lines include a first power line, a second power line, a third power line and a fourth power line. The first power line includes a plurality of first power line segments spaced apart in the first direction. The second power line is arranged to be adjacent to the first power line. The second power line includes a plurality of second power line segments and a plurality of third power line segments spaced apart in the first direction, and the second power line segments and the third power line segments are alternately distributed in sequence in the first direction. The third power line is arranged to be adjacent to the second power line, and the third power line includes a plurality of fourth power line segments spaced apart in the first direction. The fourth power line is arranged to be adjacent to the third power line, and the fourth power line includes a plurality of fifth power line segments and a plurality of sixth power line segments spaced apart in the first direction, and the fifth power line segments and the sixth power line segments are alternately distributed in sequence in the first direction. Any one of the first power line, the second power line, the third power line and the fourth power line is configured to form the second signal line, and any one of the first power line segments, the second power line segments, the third power line segments, the fourth power line segments, the fifth power line segments, and the sixth power line segments is configured to form the second signal line segment. The connection part includes a plurality of connection parts, and the connection parts include: a plurality of first connection parts, a plurality of second connection parts, and a plurality of third connection parts, the first power line segment is connected to the third power line segment through the first connection part, the fourth power line segment is connected to the fifth power line segment through the second connection part, and the fourth power line segment is connected to the sixth power line segment through the third connection part.

In an exemplary embodiment of the present disclosure, the R-electrode parts include: a plurality of first R-electrode parts arranged in the same electrode column; and a plurality of second R-electrode parts arranged in the same electrode column. The B-electrode parts include: a plurality of first B-electrode parts arranged in the same electrode column; and a plurality of second B-electrode parts arranged in the same electrode column. The G-electrode parts include: a plurality of first G-electrode parts arranged in the same electrode column; and a plurality of second G-electrode parts arranged in the same electrode column. An electrode column where the first R-electrode parts are located, an electrode column where the first B-electrode parts are located, an electrode column where the first G-electrode parts are located, an electrode column where the second R-electrode parts are located, an electrode column where the second B-electrode parts are located and an electrode column where the second G-electrode parts are located, are distributed in sequence in the second direction. The orthographic projection of the first R-electrode part on the base substrate is located in a gap between the orthographic projections of adjacent two first power line segments on the base substrate, and the adjacent two first power line segments are located in the same first power line. The orthographic projection of the first B-electrode part on the base substrate is partially located in a gap between the orthographic projections, on the base substrate, of the second power line segment and the third power line segment adjacent to each other, and the second power line segment and the third power line segment adjacent to each other are located in the same second power line. The orthographic projection of the first G-electrode part on the base substrate is partially located in a gap between the orthographic projections, on the base substrate, of the second power line segment and the third power line segment adjacent to each other, wherein the second power line segment and the third power line segment adjacent to each other are located in the same second power line. The orthographic projection of the second R-electrode part on the base substrate is partially located in a gap between the orthographic projections of adjacent two fourth power line segments on the base substrate, and the adjacent two fourth power line segments are located in the same third power line. The orthographic projection of the second B-electrode part on the base substrate is located in a gap between the orthographic projections of the fifth power line segment and the sixth power line segment adjacent to each other on the base substrate, and the fifth power line segment and the sixth power line segment adjacent to each other are located in the same fourth power line. The orthographic projection of the second G-electrode part on the base substrate is located in a gap between the orthographic projections of the fifth power line segment and the sixth power line segment adjacent to each other on the base substrate, and the fifth power line segment and the sixth power line segment adjacent to each other are located in the same fourth power line.

In an exemplary embodiment of the present disclosure, the fourth conductive layer further includes a first extension part, a second extension part and a third extension part. The first extension part is connected to the first power line segment, in the second direction, the orthographic projection of the first extension part on the base substrate is located between the orthographic projection of the first power line segment on the base substrate and the orthographic projection of the third power line segment on the base substrate, and the first extension part is connected to the third power line segment through the first connection part. The second extension part is connected to the fourth power line segment, in the second direction, the orthographic projection of the second extension part on the base substrate is located between the orthographic projection of the fourth power line segment on the base substrate and the orthographic projection of the fifth power line segment on the base substrate, and the second extension part is connected to the fifth power line segment through the second connection part. The third extension part connected to the fourth power line segment, in the second direction, the orthographic projection of the third extension part on the base substrate is located between the orthographic projection of the fourth power line segment on the base substrate and the orthographic projection of the sixth power line segment on the base substrate, and the third extension part is connected to the sixth power line segment through the third connection part.

In an exemplary embodiment of the present disclosure, the orthographic projection of the third power line segment on the base substrate is located between the orthographic projections of adjacent two first G-electrode parts on the base substrate, and the adjacent two first G-electrode parts are located in the same electrode column, and are located in different electrode rows; the orthographic projection of the fifth power line segment on the base substrate is located between the orthographic projections of adjacent two second G-electrode parts on the base substrate, and the adjacent two second G-electrode parts are located in the same electrode column, and are located in different electrode rows; the orthographic projection of the sixth power line segment on the base substrate is located between the orthographic projections of adjacent two second G-electrode parts on the base substrate, and the adjacent two second G-electrode parts are located in the same electrode column, and are located in different electrode rows.

In an exemplary embodiment of the present disclosure, the second signal line segment is connected to corresponding first signal lines through a plurality of via holes.

In an exemplary embodiment of the present disclosure, the display panel further includes a pixel driving circuit. The pixel driving circuit includes a drive transistor and a first transistor, a first electrode of the first transistor is connected to a gate of the drive transistor, and a second electrode of the first transistor is connected to a first electrode of the drive transistor. The display panel further includes an active layer, a first conductive layer, and a second conductive layer. The active layer is arranged between the base substrate and the third conductive layer, and includes: a first active part, configured to form a first channel region of the first transistor; a second active part, configured to form a second channel region of the first transistor; and a third active part, connected between the first active part and the second active part. The first conductive layer is arranged between the active layer and the third conductive layer, and includes: a first conductive part, configured to form the gate of the drive transistor; a first grid line, the orthographic projection of the first grid line on the base substrate covers the first active part, and a part of the first grid line is configured to form a first gate of the first transistor. The second conductive layer is arranged between the first conductive layer and the third conductive layer, and includes: a second conductive part, the second conductive part is connected to the first signal line through a via hole, and the orthographic projection of the second conductive part on the base substrate at least partially overlaps with the orthographic projection of the third active part on the base substrate, and the orthographic projection of the second conductive part on the base substrate is located at a side of the orthographic projection of the first grid line on the base substrate away from the orthographic projection of the first conductive part on the base substrate.

In an exemplary embodiment of the present disclosure, the orthographic projection of the second conductive part on the base substrate at least partially overlaps with the orthographic projection of the fourth active part on the base substrate.

In an exemplary embodiment of the present disclosure, the pixel driving circuit further includes a second transistor, a first electrode of the second transistor is connected to the second electrode of the drive transistor, and a second electrode of the second transistor is configured to receive a data signal. The active layer further includes: a plurality of fifth active part, configured to be connected to the second electrode of the second transistor, the orthographic projection of the fifth active part on the base substrate and the orthographic projection of the fourth active part on the base substrate are spaced apart in the second direction. The second conductive layer further includes: a third conductive part, connected to the second conductive part, the orthographic projection of the third conductive part on the base substrate is located between the orthographic projection of the fifth active part on the base substrate and the orthographic projections of the fourth active part on the base substrate.

In an exemplary embodiment of the present disclosure, the display panel includes a first pixel driving circuit and a second pixel driving circuit arranged to be adjacent in the second direction. The first conductive layer further includes: a sixth bump, where the sixth bump is connected to the first grid line, the orthographic projection of the sixth bump on the base substrate covers the second active part, and the sixth bump is configured to form a second gate of the first transistor. The display panel further includes: a light emitting layer, arranged on a side of the fifth conductive layer away from the base substrate, where the light emitting layer includes a plurality of light emitting parts, and the light emitting parts are arranged in a one-to-one correspondence with the electrode parts. The B-electrode part includes: a B-electrode body, the orthographic projection of the B-electrode body on the base substrate completely coincides with the orthographic projection of a corresponding light emitting part on the base substrate; a first bump, the first bump is connected to the B-electrode body, and the orthographic projection of the first bump on the base substrate at least partially overlaps with the orthographic projection of the sixth bump in the first pixel driving circuit on the base substrate; and a second bump, the second bump is connected to the B-electrode body, and the orthographic projection of the second bump on the base substrate at least partially overlaps with the orthographic projection of the sixth bump in the second pixel driving circuit on the base substrate.

In an exemplary embodiment of the present disclosure, the display panel further includes: a light emitting layer, arranged on a side of the fifth conductive layer away from the base substrate. The light emitting layer includes a plurality of light emitting parts, and the light emitting parts are arranged in a one-to-one correspondence with the electrode parts. The R-electrode part includes: a R-electrode body, the orthographic projection of the R-electrode body on the base substrate completely coincides with the orthographic projection of a corresponding light emitting part on the base substrate; and a third bump, the third hump is connected to the R-electrode body, and the orthographic projection of the third bump on the base substrate at least partially overlaps with the orthographic projection of the first conductive part on the base substrate.

In an exemplary embodiment of the present disclosure, the display panel includes a third pixel driving circuit and a fourth pixel driving circuit arranged to be adjacent in the first direction. The display panel further includes: a light emitting layer, arranged on a side of the fifth conductive layer away from the base substrate. The light emitting layer includes a plurality of light emitting parts, and the light emitting parts are arranged in a one-to-one correspondence with the electrode parts. Some of the G-electrode parts includes: a G-electrode body, the orthographic projection of the G-electrode body on the base substrate completely coincides with the orthographic projection of a corresponding light emitting part on the base substrate; a fourth bump, the fourth bump is connected to the G-electrode body, and the orthographic projection of the fourth bump on the base substrate at least partially overlaps with the orthographic projection of the first conductive part in the third pixel driving circuit on the base substrate; and a fifth bump, the fifth bump is connected to the G-electrode body, and the orthographic projection of the fifth bump on the base substrate at least partially overlaps with the orthographic projection of the sixth bump in the fourth pixel driving circuit on the base substrate.

According to an aspect of the present disclosure, a display device including the above display panel in provided.

It should be understood that the above general description and detailed description described below are only exemplary and explanatory, and not intended to limit the present disclosure.

BRIEF DESCRIPTION OF THE DRAWINGS

The drawings herein, which are incorporated into the specification and constitute a part of the specification, show embodiments in accordance with the present disclosure, and explain the principle of the present disclosure in conjunction with the specification. It is apparent that the drawings in the following description are only some embodiments of the present disclosure, for those ordinary skilled in the art, other drawings can be obtained based on these drawings without paying creative work.

DETAILED DESCRIPTION

Figure 1:
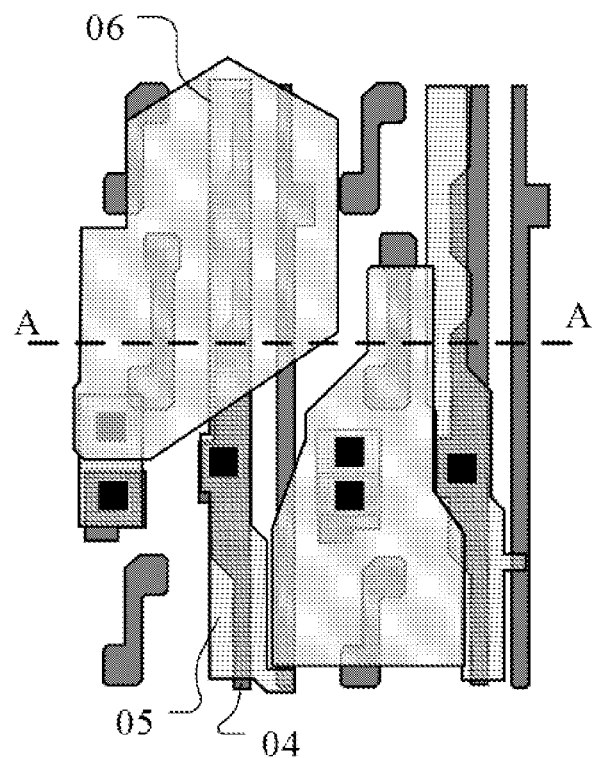
FIG. 1 is a structural layout of a display panel in the related art.

Exemplary embodiments will now be described more fully with reference to the accompanying drawings. However, the exemplary embodiments can be implemented in various forms, and should not be construed as being limited to the embodiments set forth herein. On the contrary, these embodiments are provided to make the present disclosure comprehensive and complete, and the concept of the exemplary embodiments may be fully conveyed to those skilled in the art. The same reference signs in the drawings indicate the same or similar structures, and thus their detailed descriptions will be omitted.

Although relative terms such as "upper" and "lower" are used in this specification to describe a relative relationship between one component and another component, these terms are used only for convenience, for example, are used for referring to example directions as shown in the drawings. It can be understood that if the devices are turned upside down, the component described as "upper" will become the "lower" component. Other relative terms such as "higher", "lower", "top", "bottom", "left" and "right" have similar meanings. When a structure is "on" another structure, it may mean that the structure is integrally formed on the other structure, or that the structure is "directly" installed on the other structure, or that the structure is "indirectly" installed on the other structure through another structure.

The terms "a", "an", "the", and the like are used to indicate the presence of one or more elements/components/etc.; the terms "including" and "having" are used to indicate an open-ended inclusive meaning and mean that additional elements/components/etc. may be presented in addition to the listed elements/components/etc.

Figure 2:
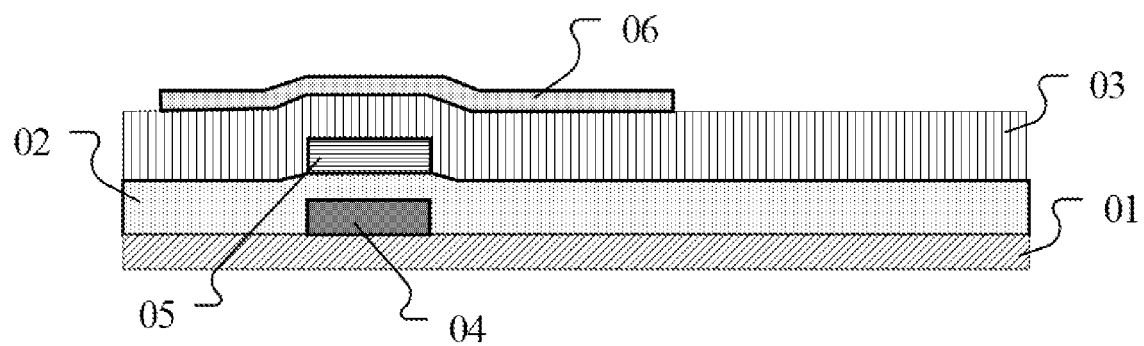
FIG. 2 is a partial cross-sectional view along dotted line A-A in FIG. 1.

In the related art, a display panel can transmit the same signal through two layers of signal lines, so as to reduce signal attenuation due to impedances of the signal lines. For example, as shown in FIGS. 1 and 2, FIG. 1 is a structural layout of a display panel in the related art, and FIG. 2 is a partial cross-sectional view taken along dotted line A-A in FIG. 1. The display panel may include a base substrate 01, a first source-drain layer, a first flat layer 02, a second source-drain layer, a second flat layer 03, and an anode layer that are stacked in sequence. As shown in FIG. 1, a first source-drain layer may include a first power line 04, a second source-drain layer may include a second power line 05, and an anode layer may include an anode part 06. The first power line 04 and the second power line 05 may be used to provide a power signal to sub-pixel units in the same column. As shown in FIG. 2, an orthographic projection of the first power line 04 on the base substrate 01 partially overlaps with an orthographic projection of the second power line 05 on the base substrate 01. Since the first power line 04 and the second power line 05 are thick, the first power line 04 will affect the flatness of a first flat layer 02 located thereon, and the second power line 05 will affect the flatness of a second flat layer 03 located thereon. Due to the first power line 04 and the second power line 05, the anode part 06 located on the second flat layer 03 will be significantly inclined. The inclination of the anode part 06 will cause a single sub-pixel unit to have different luminous intensities in different directions, resulting in the color shift at a large viewing angle in the display panel. For example, a phenomenon that the display panel renders red from a viewing angle on one side and renders cyan from a viewing angle on the other side will occur.

Figure 3:
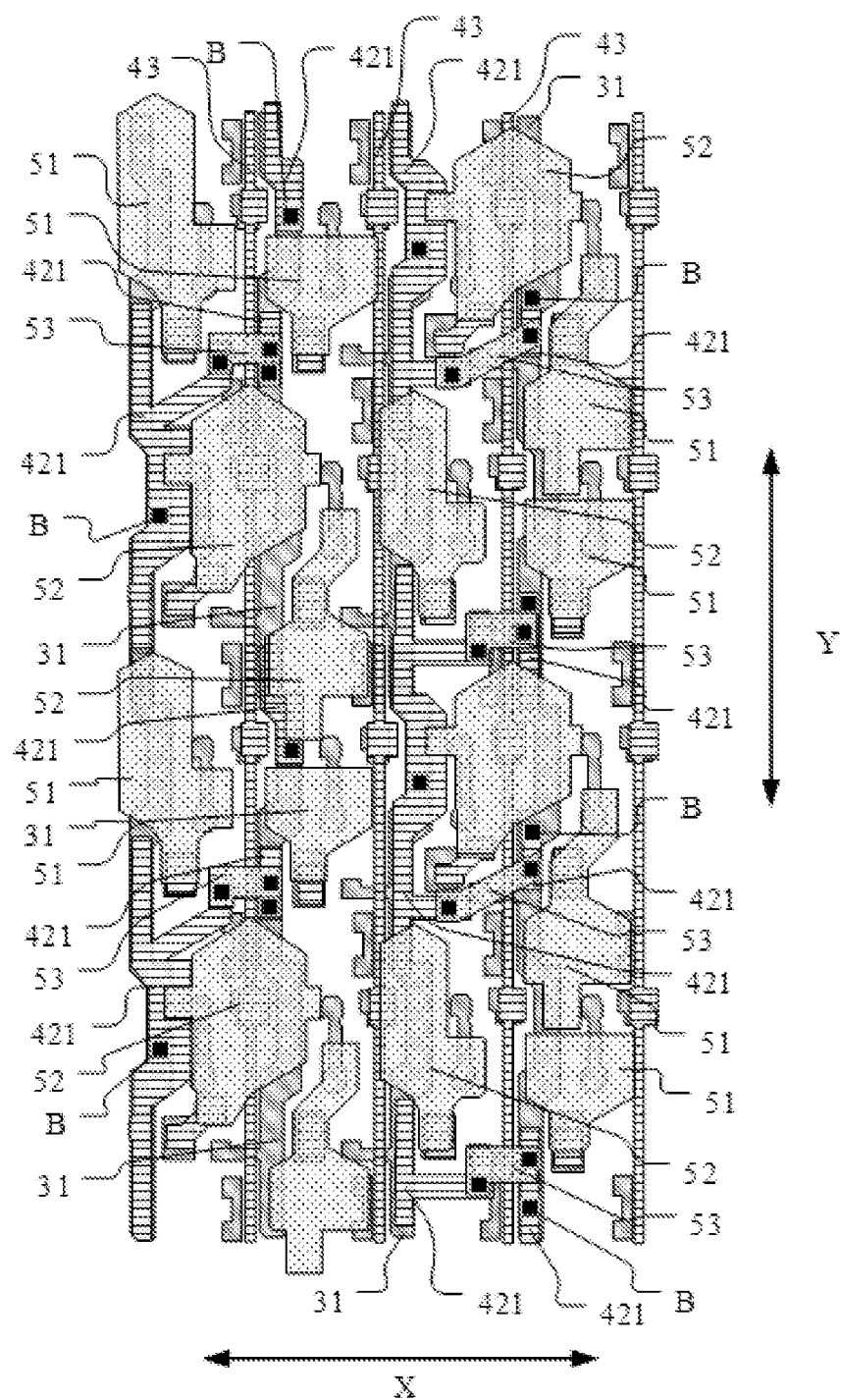
FIG. 3 is a structural layout of a display pan& according to an exemplary embodiment of the present disclosure.
Figure 4:
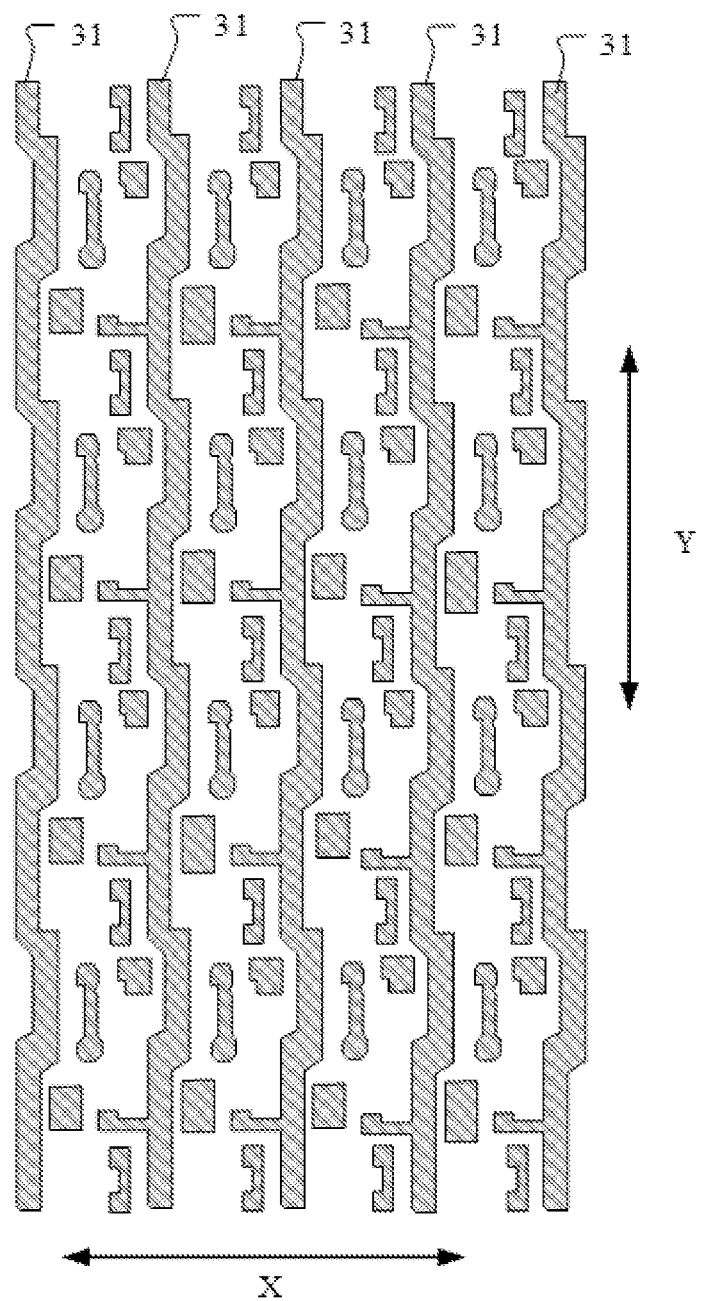
FIG. 4 is a structural layout of a third conductive layer in FIG. 3.
Figure 5:
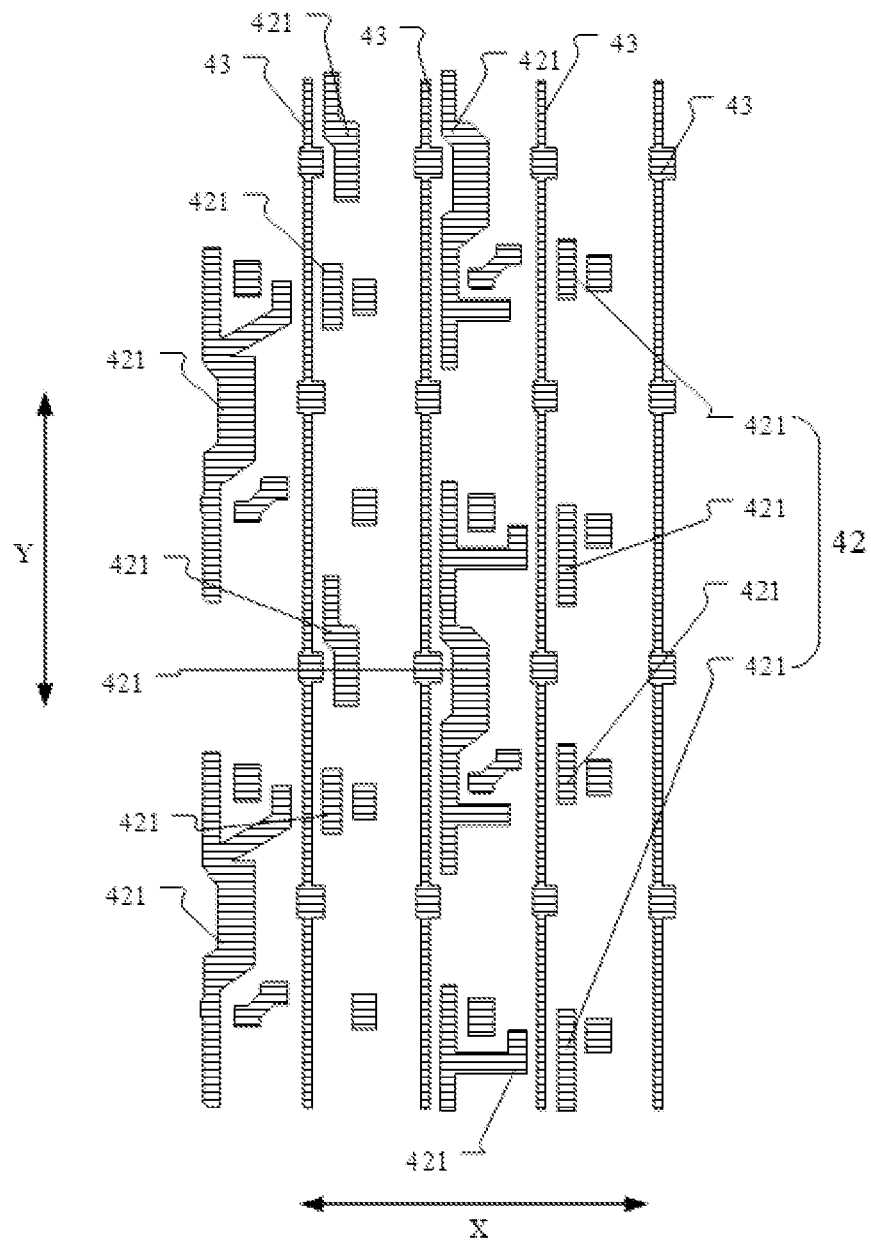
FIG. 5 is a structural layout of a fourth conductive layer in FIG. 3.
Figure 6:
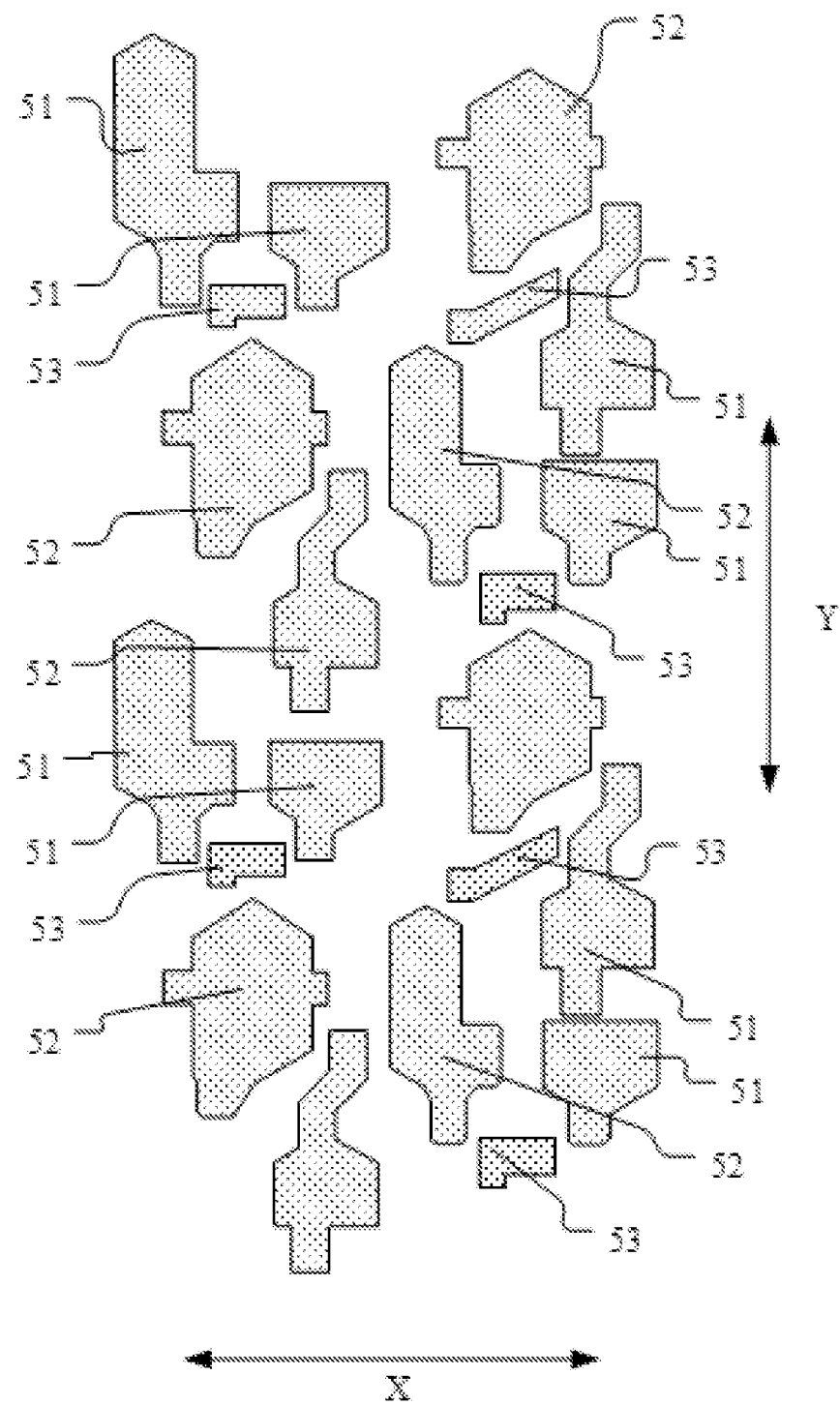
FIG. 6 is a structural layout of a fifth conductive layer in FIG. 3.

In view of this, exemplary embodiments provide a display panel as shown in FIGS. 3-6, FIG. 3 is a structural layout of a display panel according to an exemplary embodiment of the present disclosure, FIG. 4 is a structural layout of a third conductive layer in FIG. 3, FIG. 5 is a structural layout of a fourth conductive layer in FIG. 3, and FIG. 6 is a structural layout of a fifth conductive layer in FIG. 3. The display panel may include a plurality of structures shown in FIG. 3. The display panel can include a base substrate, a third conductive layer, a fourth conductive layer, and a fifth conductive layer. The third conductive layer is arranged on a side of the base substrate. The third conductive layer can include a plurality of first signal lines 31, and the orthographic projections of the first signal lines 31 on the base substrate may extend in a first direction Y and are spaced apart in the second direction X, where the first direction Y may intersect with the second direction X, for example, the first direction may be perpendicular to the second direction. The fourth conductive layer may be arranged on a side of the third conductive layer away from the base substrate. The fourth conductive layer may include a plurality of second signal lines 42, and the orthographic projections of the second signal lines 42 on the base substrate may extend in the first direction Y and be spaced apart in the second direction X. The plurality of the second signal lines 42 may be arranged in a one-to-one correspondence with the plurality of the first signal lines 31. Each of the second signal lines 42 may include a plurality of second signal line segments 421. The orthographic projections of the second signal line segments 421 belonging to the same second signal line on the base substrate may be spaced apart in the first direction Y, and may extend in the first direction Y. The orthographic projections of each second signal line segment 421 and the corresponding first signal line 31 (that is, the first signal line corresponding to the second signal line to which the second signal line segment belongs) on the base substrate at least partially overlap, so that each second signal line segment 421 can be electrically connected to the corresponding first signal line 31 through a via hole B. The fifth conductive layer may be arranged on a side of the fourth conductive layer away from the base substrate. The fifth conductive layer may include a plurality of electrode parts 51 and a plurality of electrode parts 52, and the electrode parts 51, 52 may be used to form electrodes of light emitting cells. The orthographic projections of the electrode parts 51, 52 on the base substrate may be partially located in a gap between the orthographic projections, on the base substrate, of adjacent two second signal line segments 421 in the same second signal line.

In the display panel provided by this exemplary embodiment, each of the second signal lines is arranged to include a plurality of second signal line segments spaced in the first direction Y, so that the orthographic projections of the electrode parts on the base substrate are partially located in the gap between the orthographic projections of adjacent two second signal line segments 421 of the same second signal line on the base substrate. Since the orthographic projections of the electrode parts on the base substrate are partially located in the gap between the orthographic projections of adjacent two second signal line segments 421 of the same second signal line on the base substrate, an area where the electrode parts overlap with both the first signal lines and the second signal lines can be reduced, thereby reducing or avoiding the inclination on the electrode parts caused by the dual actions of the first signal lines and the second signal lines, and further improving the display effect of the display panel. In addition, the display panel can also transmit the same signal through the first signal line and the second signal line, thereby reducing the attenuation due to a voltage drop of the signal line itself during a signal transmission process.

In this exemplary embodiment, as shown in FIG. 3, the orthographic projection of the electrode part 51 on the base substrate does not overlap with the orthographic projection of the second signal line on the base substrate, so that the flatness of the electrode part 51 is better. The orthographic projection of the electrode part 52 on the base substrate partially overlaps with the orthographic projection of the second signal line on the base substrate, so that the flatness of the electrode part 52 is better to a certain extent, and the flatness of the electrode part 52 is relatively lower than the flatness of the electrode part 51. As shown in FIG. 3, each second signal line segment 421 may be connected to the corresponding first signal line 31 through a via hole.

It should be understood that, in other exemplary embodiments, the orthographic projections, on the base substrate, of only some of the electrode parts in the display panel may also be located in the gap between the orthographic projections, on the base substrate, of adjacent two signal line segments 421 of the same second signal line. In other exemplary embodiments, the orthographic projections of all the electrode parts on the base substrate may also not overlap with the orthographic projections of the second signal lines on the base substrate. Each second signal line segment 421 may be connected to a corresponding first signal line 31 through a plurality of via holes. For example, each second signal line segment 421 may be connected to a corresponding first signal line 31 through two via holes, and the two via holes may be located at two ends of the second signal line segment.

In this exemplary embodiment, the first signal line and the second signal line may be used to provide the same power signal. It should be understood that, in other exemplary embodiments, the first signal line and the second signal line may also transmit other signals, for example, the first signal line and the second signal line may also be used to provide a data signal.

In this exemplary embodiment, as shown in FIGS. 3, 5 and 6, the fourth conductive layer may further include a plurality of third signal lines 43, and the orthographic projections of the third signal lines 43 on the base substrate may be located between the orthographic projections of adjacent two second signal lines on the base substrate. The fifth conductive layer may further include a plurality of connection parts 53. The connection part 53 can connect adjacent two second signal lines through via holes respectively, thereby connecting adjacent two first signal lines. For example, as shown in FIG. 3, from left to right, the first one and the second one of the first signal lines may be connected to each other, and the third one and the fourth one of the first signal lines may be connected to each other. Such arrangement makes some adjacent two first signal lines form a parallel structure, thereby further reducing the impedance of the first signal lines in the extending direction. It should be understood that, in other exemplary embodiments, adjacent first signal lines in the display panel may also be connected in other ways. For example, every adjacent two first signal lines in the display panel are connected to each other, or at least some of adjacent two first signal lines are electrically connected. There may be one or more connection parts for connecting adjacent two first signal lines in the same group.

Figure 7:
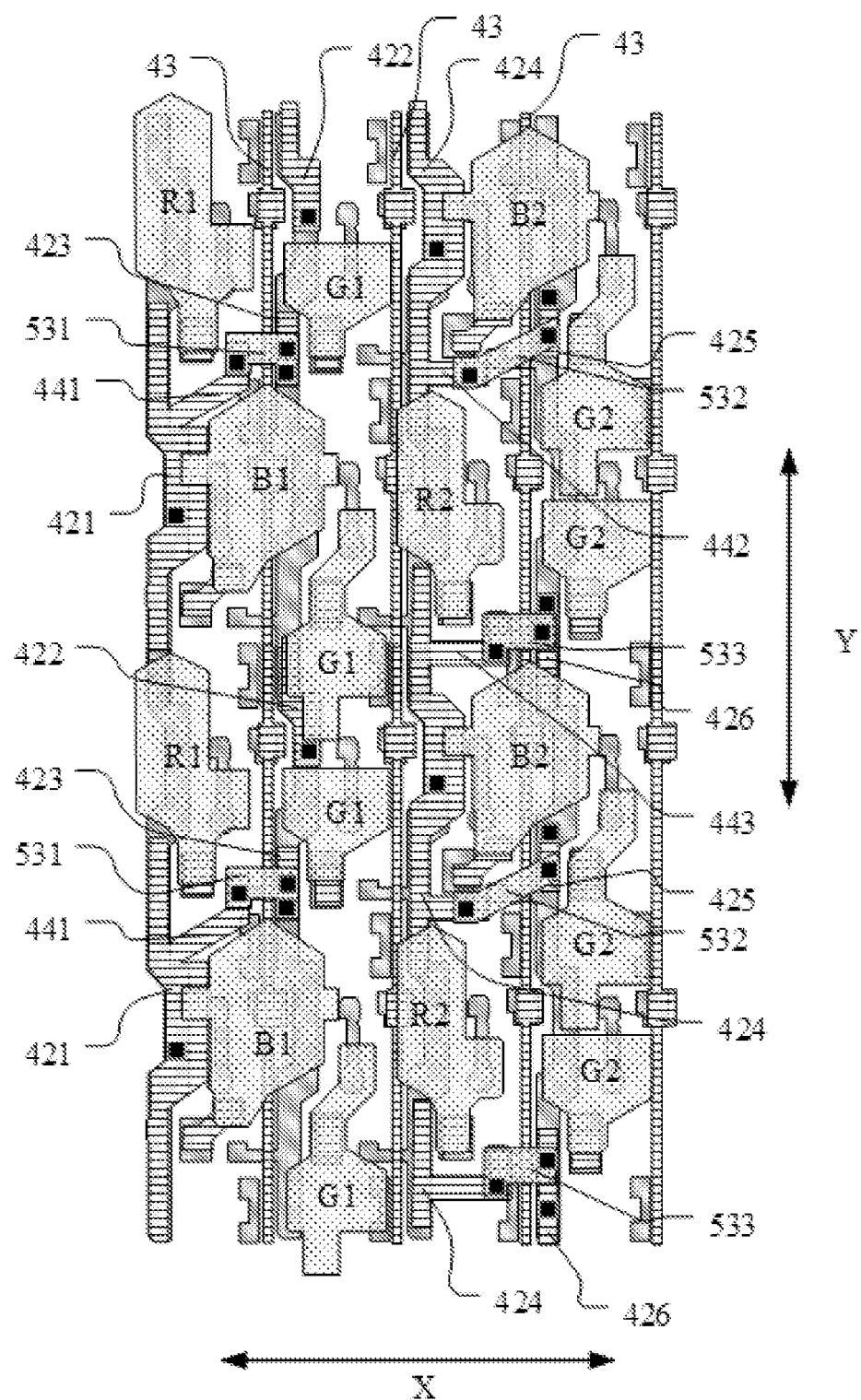
FIG. 7 is a structural layout of a display panel according to an exemplary embodiment of the present disclosure.
Figure 8:
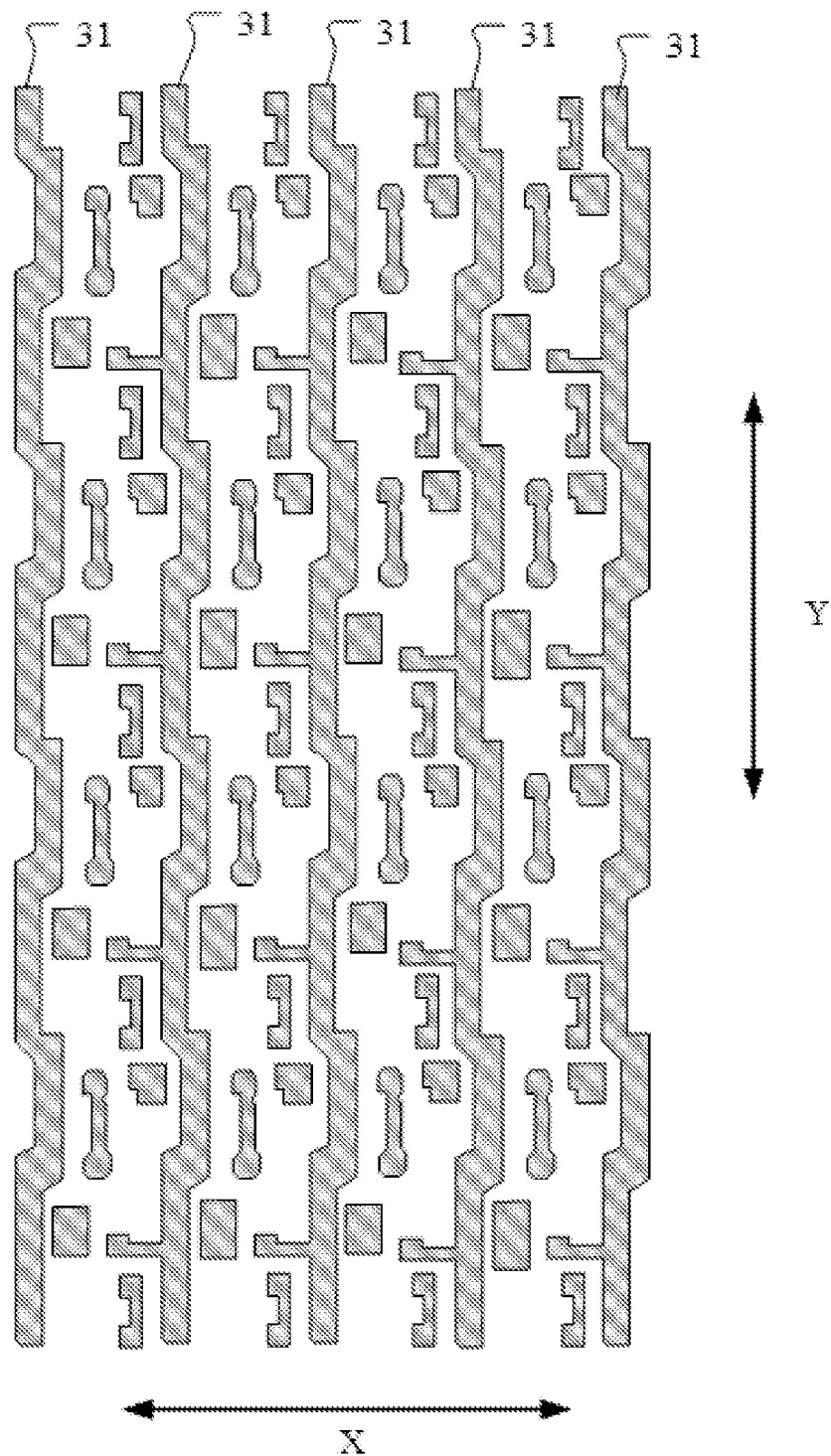
FIG. 8 is a structural layout of a third conductive layer in FIG. 7.
Figure 9:
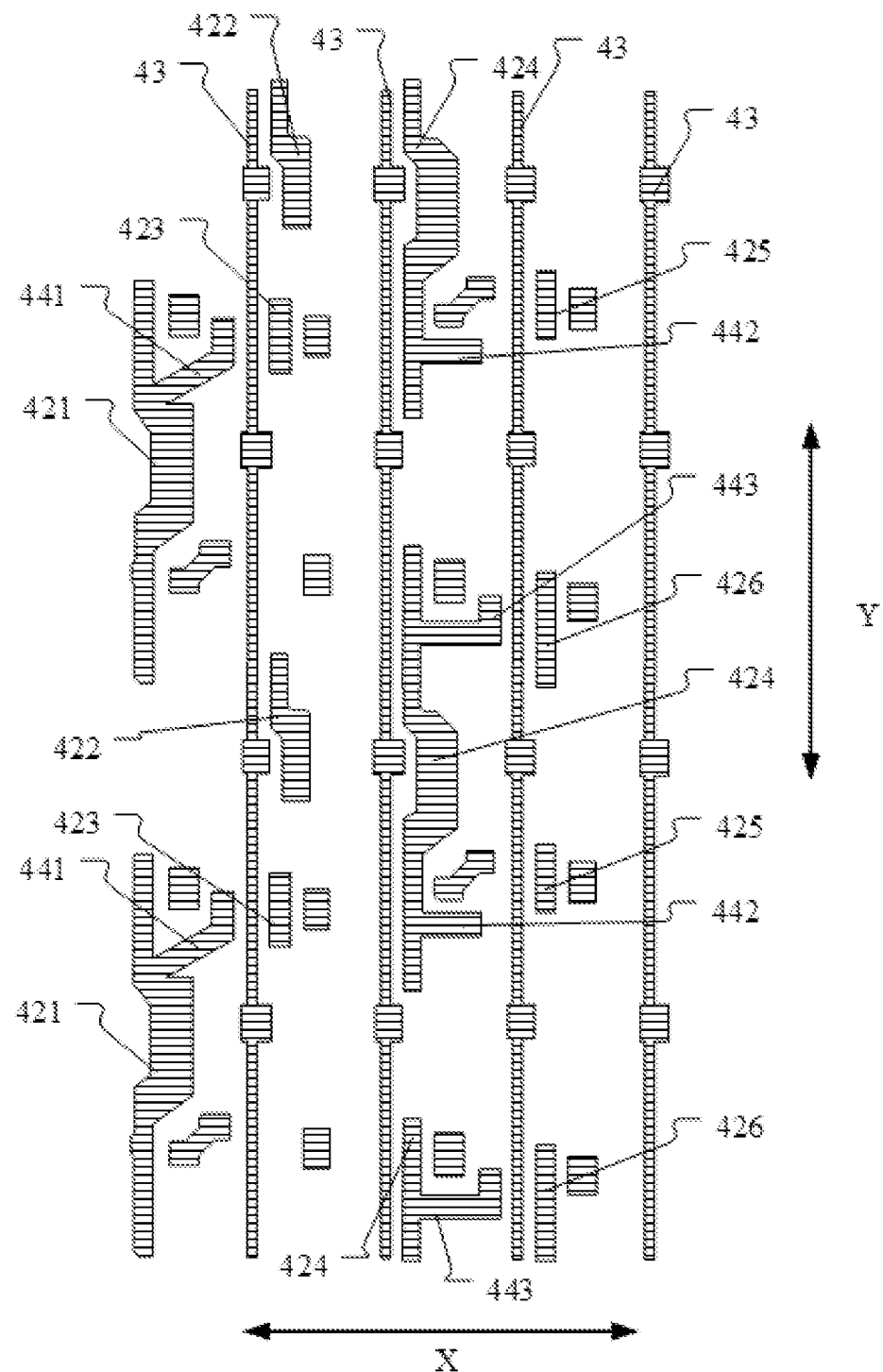
FIG. 9 is a structural layout of a fourth conductive layer in FIG. 7.
Figure 10:
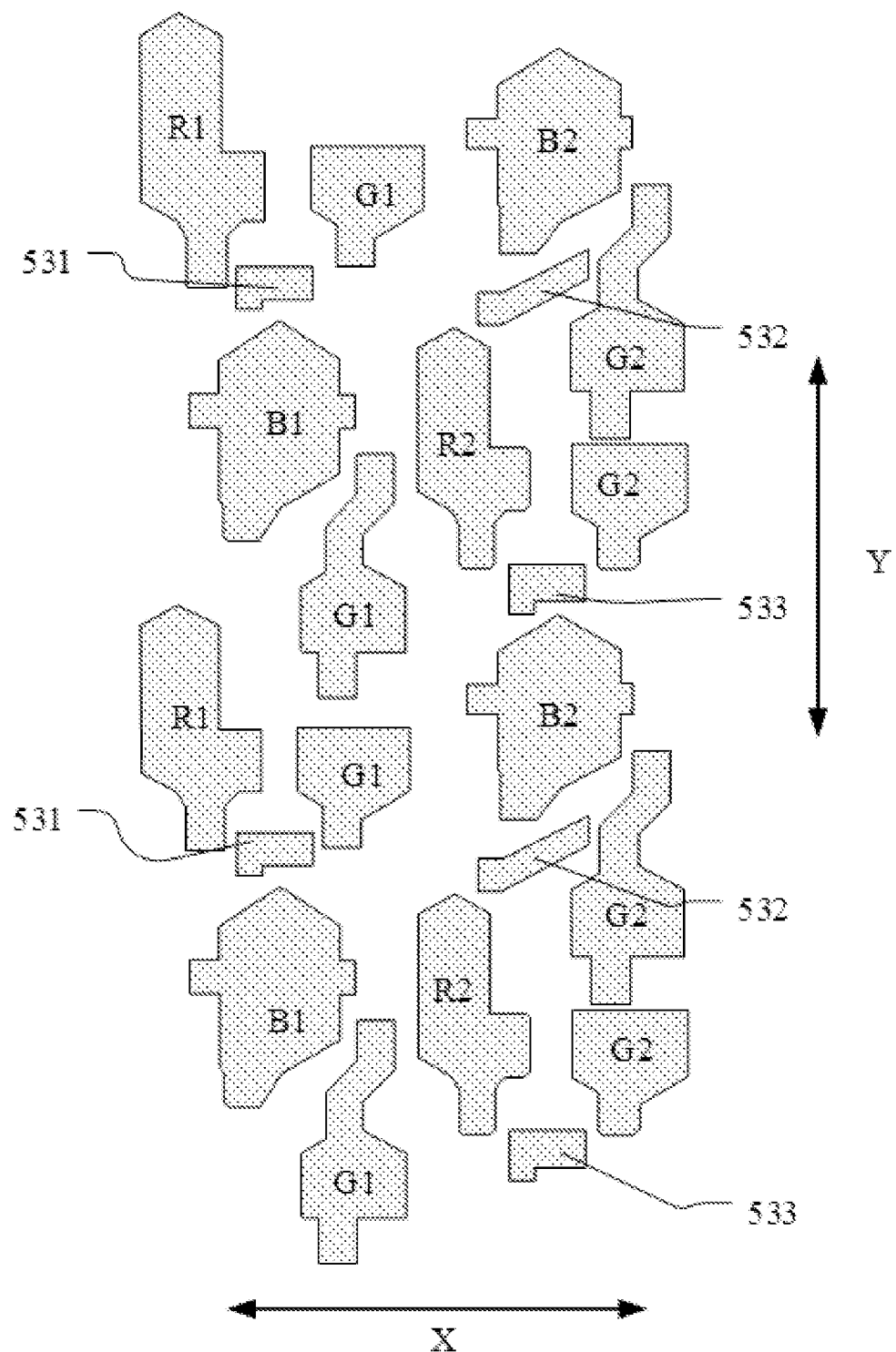
FIG. 10 is a structural layout of a fifth conductive layer in FIG. 7.

In this exemplary embodiment, as shown in FIGS. 7-10, FIG. 7 is a structural layout of a display panel according to an exemplary embodiment of the present disclosure, and FIG. 8 is a structural layout of the third conductive layer in FIG. 7, FIG. 9 is a structural layout of the fourth conductive layer in FIG. 7, and FIG. 10 is a structural layout of the fifth conductive layer in FIG. 7. The display panel may include a plurality of structures shown in FIG. 7. The structural layout of the display panel shown in FIG. 7 is the same as that of the display panel shown in FIG. 3, and some structures in FIG. 3 are renamed and marked in FIG. 7. The first direction Y may be a column direction, and the second direction X may be a row direction. The plurality of electrode parts may include R-electrode parts, B-electrode parts, and B-electrode parts. The R-electrode parts, G-electrode parts, and B-electrode parts are alternately distributed in sequence along the same electrode row. In the same electrode row, two G-electrode parts distributed along the column direction are arranged between the R-electrode part and the B-electrode part. In adjacent electrode rows, electrode parts for the same color are located in different columns, and in two electrode rows separated by one electrode row, electrode parts for the same color are located in the same column. In this exemplary embodiment, as shown in FIGS. 7 and 10, the R-electrode parts includes a plurality of first R-electrode parts R1, a plurality of second R-electrode parts R2. The plurality of the first R-electrode parts R1 are located in the same electrode column, and the plurality of second R-electrode parts R2 are located in the same electrode column. The B-electrode parts include a plurality of first B-electrode parts B1 and a plurality of second B-electrode parts B2. The plurality of first B-electrode parts B1 are located in the same electrode column, and the plurality of second B-electrode parts B2 are located in the same electrode column. The G-electrode parts include a plurality of first G-electrode parts G1 and a plurality of second G-electrode parts G2. The plurality of first G-electrode parts are located in the same electrode column, and the plurality of second G-electrode parts G2 are located in the same electrode column. The electrode column where the first R-electrode parts R1 are located, the electrode column where the first B-electrode parts B1 are located, the electrode column where the first G-electrode parts G1 are located, the electrode column where the second R-electrode parts R2 are located, the electrode column where the second B-electrode parts B2 are located and the electrode column where the second G-electrode parts G2 are located, are distributed in sequence in the second direction X.

In this exemplary embodiment, as shown in FIGS. 7 and 9, the plurality of second signal lines may include a first power line, a second power line, a third power line, and a fourth power line. The first power line may include a plurality of first power line segments 421 spaced apart in the first direction. The second power line is arranged to be adjacent to the first power line. The second power line may include a plurality of second power line segments 422 and a plurality of third power line segments 423 spaced apart in the first direction. The second power line segment 422 and the third power line segment 423 are alternately distributed in sequence in the first direction Y. The third power line is arranged to be adjacent to the second power line, and the third power line may include a plurality of fourth power line segments 424 spaced apart in the first direction. The fourth power line is arranged to be adjacent to the third power line, and the fourth power line may include a plurality of fifth power line segments 425 and a plurality of sixth power line segments 426 spaced in the first direction Y. The fifth power line segment 425 and the sixth power line segment 426 are alternately distributed in sequence in the first direction Y. Any one of the first power line, the second power line, the third power line and the fourth power line can be used to form the second signal line shown in FIG. 3, and any one of the first power line segments, the second power line segments, the third power line segments, the fourth power line segments, the fifth power line segments, and the sixth power line segments can be used to form the second signal line segment shown in FIG. 3. There may be a plurality of connection parts, and the connection parts include: a plurality of first connection parts 531, a plurality of second connection parts 532, and a plurality of third connection parts 533. The first power line segment 421 can be connected to the third power line segment 423 through the first connection part 531, the fourth power line segment 424 can be connected to the fifth power line segment 425 through the second connection part 532, and the fourth power line segment 424 can be connected to the sixth power line segment 426 through the third connection part 533.

In this exemplary embodiment, as shown in FIG. 7, the orthographic projection of the first R-electrode part R1 on the base substrate is partially located in the gap between the orthographic projections of adjacent two first power line segments 421 on the base substrate, where the adjacent two first power line segments 421 are located on the same first power line. The orthographic projection of the first B-electrode part B1 on the base substrate is partially located in the gap between the orthographic projections of the adjacent second power line segment 422 and the third power line segment 423 on the base substrate, where the adjacent second power line segment 422 and the third power line segment 423 are located on the same second power line. The orthographic projection of the first G-electrode part G1 on the base substrate is partially located in the gap between the orthographic projections of the adjacent second power line segment 422 and the third power line segment 423 on the base substrate. Where the adjacent second power line segment 422 and the third power line segment 423 are located on the same second power line. The orthographic projection of the second R-electrode part R2 on the base substrate is partially located in the gap between the orthographic projections of adjacent two fourth power line segments 424 on the base substrate, and the adjacent two fourth power line segments 424 are located in the same third power line. The orthographic projection of the second B-electrode part B2 on the base substrate is partially located in the gap between the orthographic projections of the adjacent fifth power line segment 425 and the sixth power line segment 426 on the base substrate, and the adjacent fifth power line segment 425 and the sixth power line segment 426 are located in the same fourth power line. The orthographic projection of the second G-electrode part G2 on the base substrate is partially located in the gap between the orthographic projections of the adjacent fifth power line segment 425 and the sixth power line segment 426 on the base substrate, and the adjacent fifth power line segment 425 and the sixth power line segment 426 are located in the same fourth power line.

In this exemplary embodiment, as shown in FIGS. 7 and 9, the fourth conductive layer may further include: a plurality of first extension parts 441, a plurality of second extension parts 442, and a plurality of third extension parts 443. The first extension part 441 is connected to the first power line segment 421. In the second direction X, the orthographic projection of the first extension part 441 on the base substrate may be located between the orthographic projection of the first power line segment 421 on the base substrate and the orthographic projection of the third power line segment 423 on the base substrate. The first extension part 441 can be connected to the third power line segment 423 through the first connection part 531. The second extension part 442 can be connected to the fourth power line segment 424. In the second direction X, the orthographic projection of the second extension part 442 on the base substrate may be located between the orthographic projection of the fourth power line segment 424 on the base substrate and the orthographic projection of the fifth power line segment 425 on the base substrate. The second extension part 442 can be connected to the fifth power line segment 425 through the second connection part 532. The third extension part 443 can be connected to the fourth power line segment 424. In the second direction X, the orthographic projection of the third extension part 443 on the base substrate may be located between the orthographic projection of the fourth power line segment 424 on the base substrate and the orthographic projection of the sixth power line segment 426 on the base substrate. The third extension part 443 can be connected to the sixth power line segment 426 through the third connection part 533.

In this exemplary embodiment, as shown in FIG. 7, the orthographic projection of the third power line segment 423 on the base substrate may be located between the orthographic projections of adjacent two first G-electrode parts G1 on the base substrate. The adjacent two first G-electrode parts G1 are located in the same electrode column and are located in different electrode rows. The orthographic projection of the fifth power line segment 425 on the base substrate may be located between the orthographic projections of adjacent two second G-electrode parts G2 on the base substrate, and the adjacent two second G-electrode parts G2 are located in the same electrode column, and are located in different electrode rows. The orthographic projection of the sixth power line segment 426 on the base substrate may be located between the orthographic projections of adjacent two second G-electrode parts G2 on the base substrate, and the adjacent two second G-electrode parts G2 are located in the same electrode column, and are located in different electrode rows.

The design of the power line segments, the connection parts, the electrode parts and the extension parts described above can realize the connection of adjacent first signal lines in the limited layout space of the display panel, and at the same time, such arrangement can also greatly reduce the area where the electrode part overlaps with both of the first signal line and the second signal line.

Figure 11:
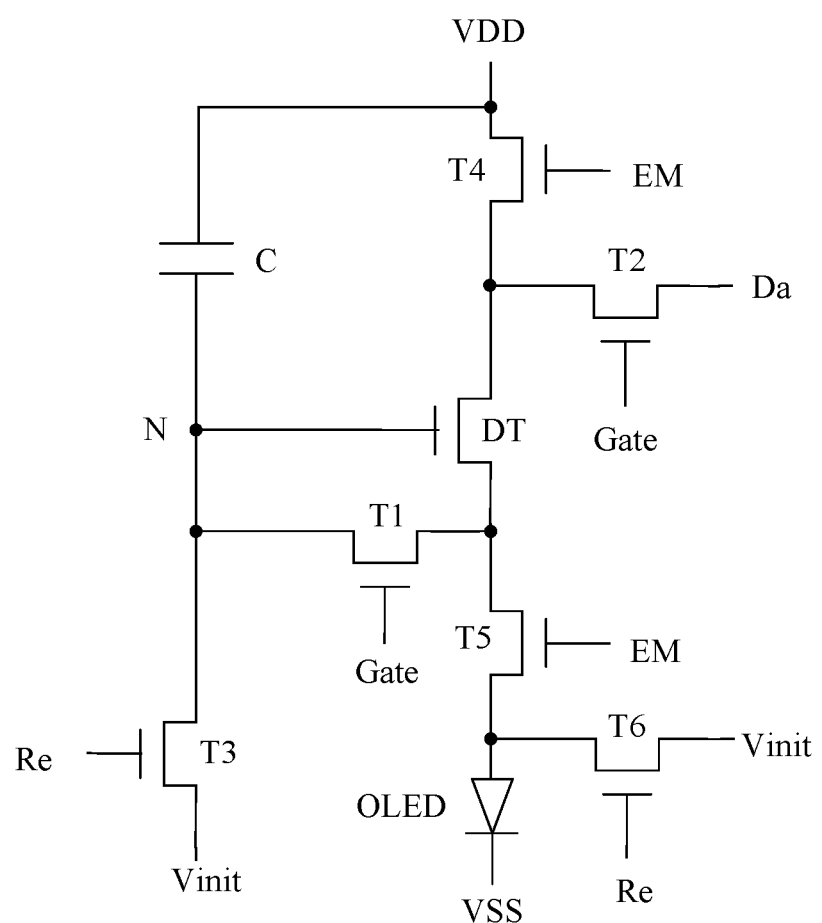
FIG. 11 is a schematic structural diagram of a pixel driving circuit in a display panel of an exemplary embodiment of the present disclosure.

In this exemplary embodiment, the display panel may further include a pixel driving circuit. FIG. 11 is a schematic structural diagram of a pixel driving circuit in an exemplary embodiment of the display panel of the present disclosure. The pixel driving circuit may include a drive transistor DT, a first transistor T1, a second transistor T2, a third transistor T3, a fourth transistor T4, a fifth transistor T5, a sixth transistor T6, and a capacitor C. The gate of the drive transistor DT is connected to a node N. A first electrode of the first transistor T1 is connected to the node N, and a second electrode of the first transistor T1 is connected to a first electrode of the drive transistor DT. A first electrode of the second transistor T2 is connected to a second electrode of the drive transistor DT, a second electrode of the second transistor T2 is connected to a data signal terminal, and a gate of the second transistor T2 is connected to a gate driving signal terminal. A first electrode of the third transistor T3 is connected to an initialization signal terminal Vinit, a second electrode of the third transistor T3 is connected to the node N, the gate of the third transistor T3 is connected to a reset signal terminal Re. A first electrode of the fourth transistor T4 is connected to the first power supply terminal VDD, and a second electrode of the fourth transistor T4 is connected to the second electrode of DT, the gate of the fourth transistor T4 is connected to an enable signal terminal EM. A first electrode of the fifth transistor T5 is connected to the first electrode of the drive transistor DT, and the gate of the fifth transistor T5 is connected to an enable signal terminal EM A first electrode of the sixth transistor T6 is connected to the initialization signal terminal Vinit, the second electrode of the sixth transistor T6 is connected to the second electrode of the fifth transistor T5, the gate of the sixth transistor T6 is connected to the reset signal terminal Re. The capacitor C is connected between the first power supply terminal VDD and the node N. The pixel driving circuit may be connected to a light emitting unit OLED to drive the light emitting unit OLED to emit light, and the light emitting unit OLED may be connected between the second electrode of the fifth transistor T5 and the second power supply terminal VSS. The transistors T1-T6 and DT may all be P-type transistors or all N-type transistors. In this embodiment, description is made by taking the N-type transistors as an example.

Figure 12:
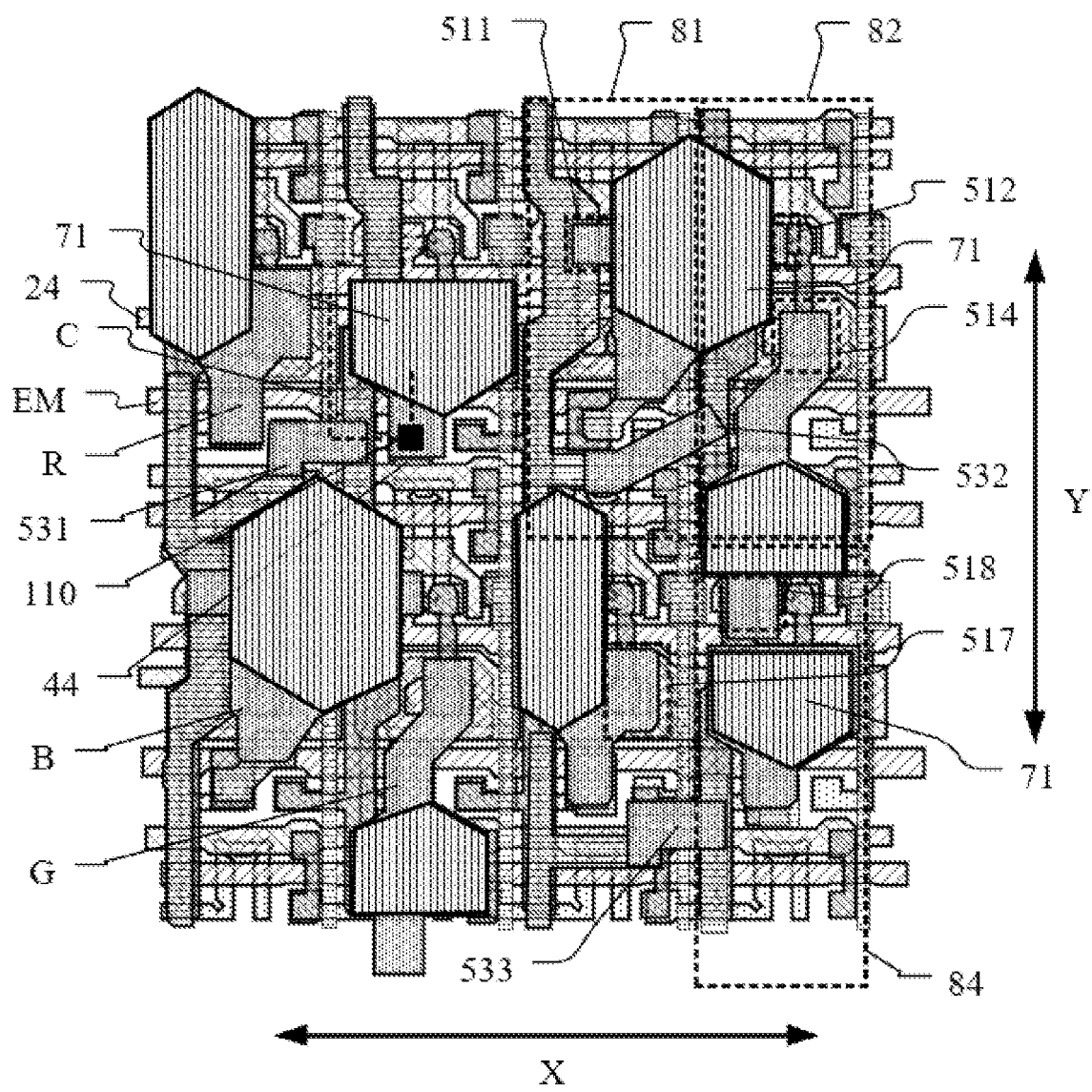
FIG. 12 is a structural layout of a display panel according to another exemplary embodiment of the present disclosure.
Figure 13:
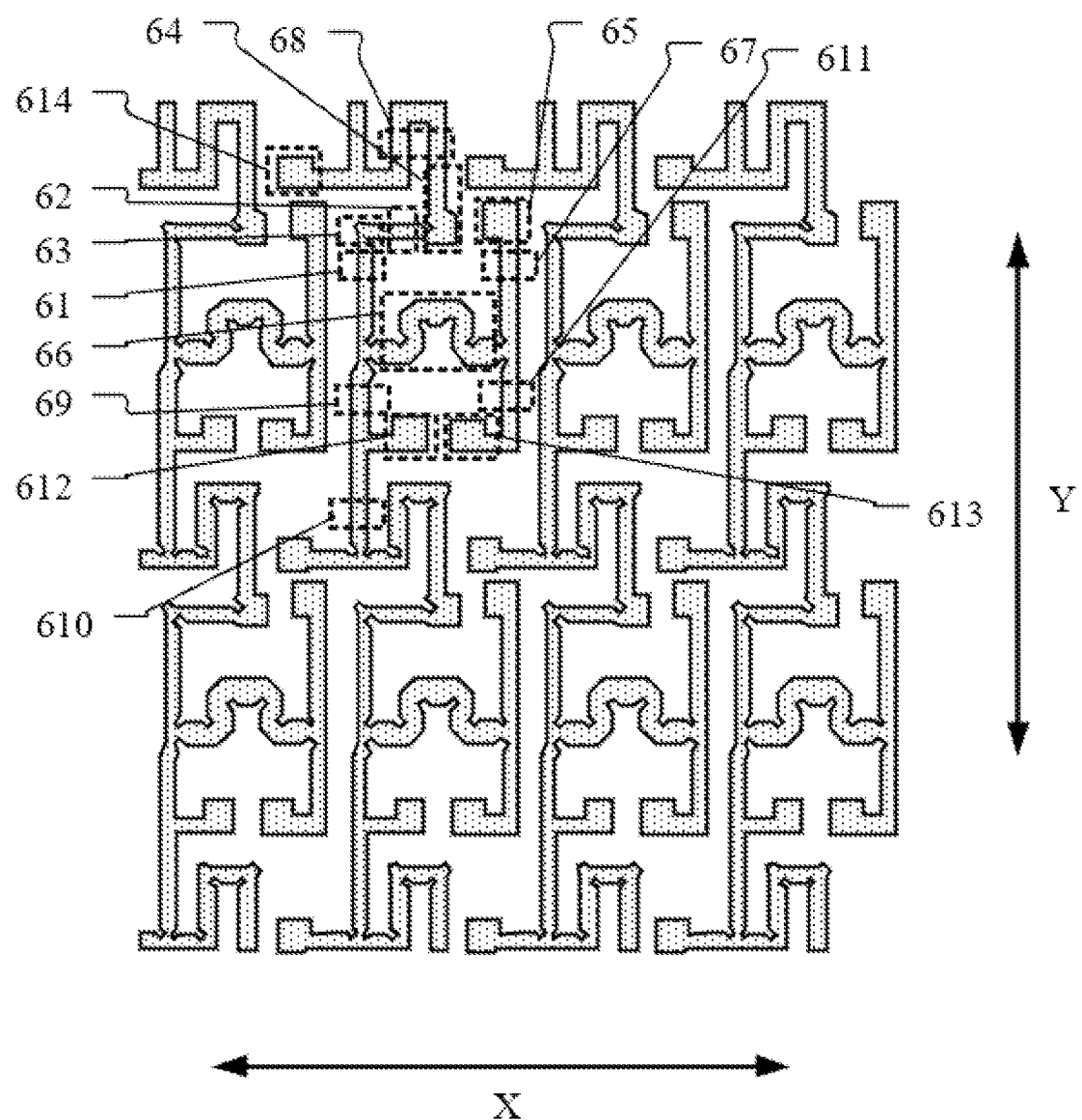
FIG. 13 is a structural layout of an active layer in FIG. 12.
Figure 14:
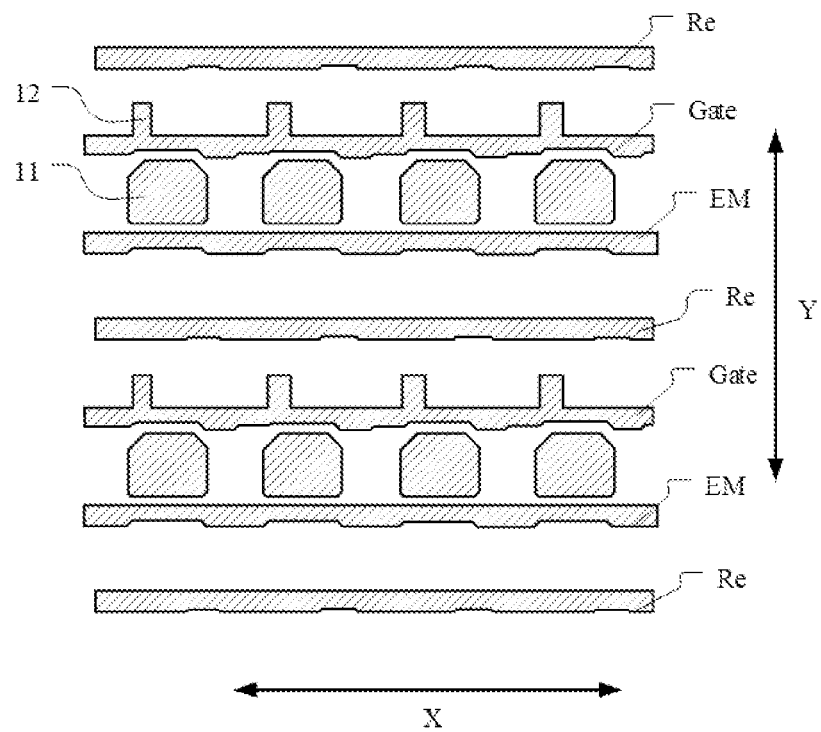
FIG. 14 is a structural layout of a first conductive layer in FIG. 12.
Figure 15:
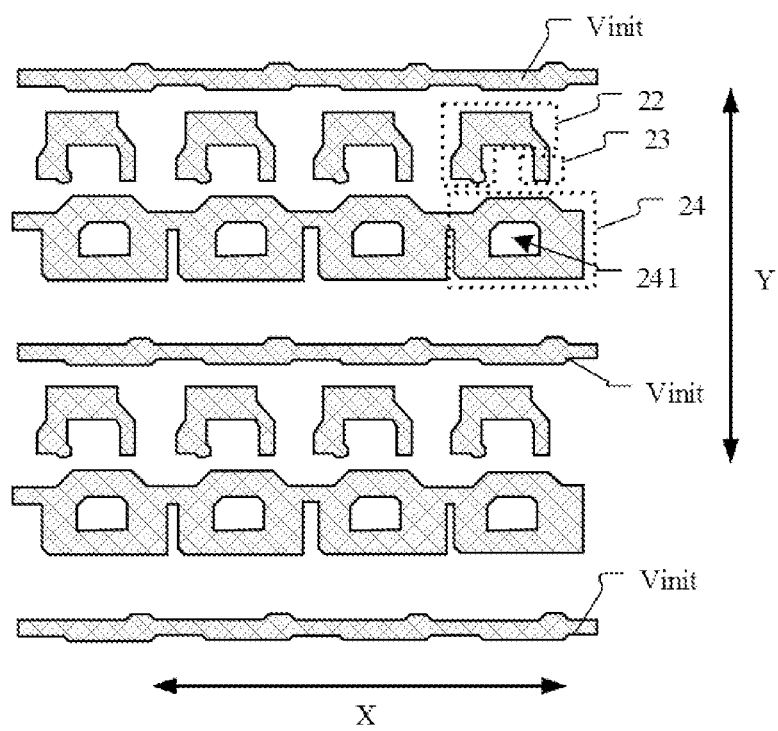
FIG. 15 is a structural layout of a second conductive layer in FIG. 12.
Figure 16:
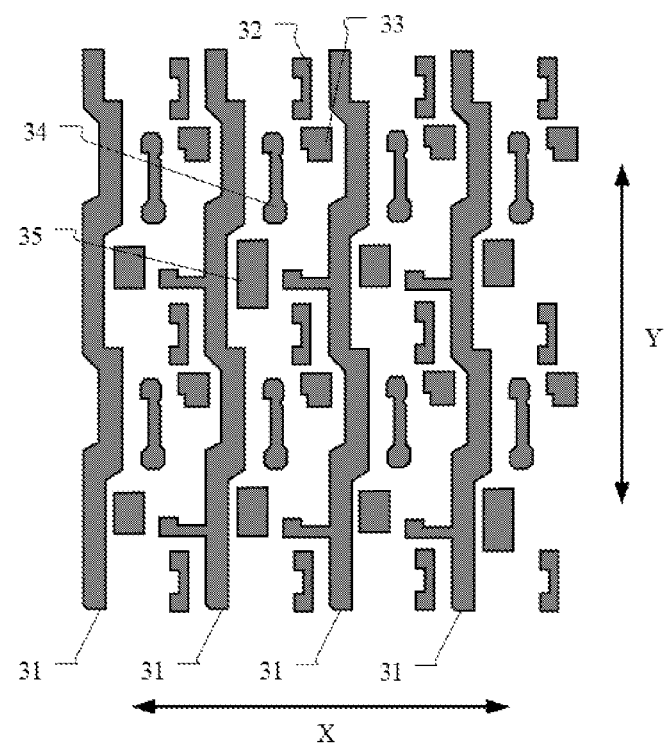
FIG. 16 is a structural layout of a third conductive layer in FIG. 12.
Figure 17:
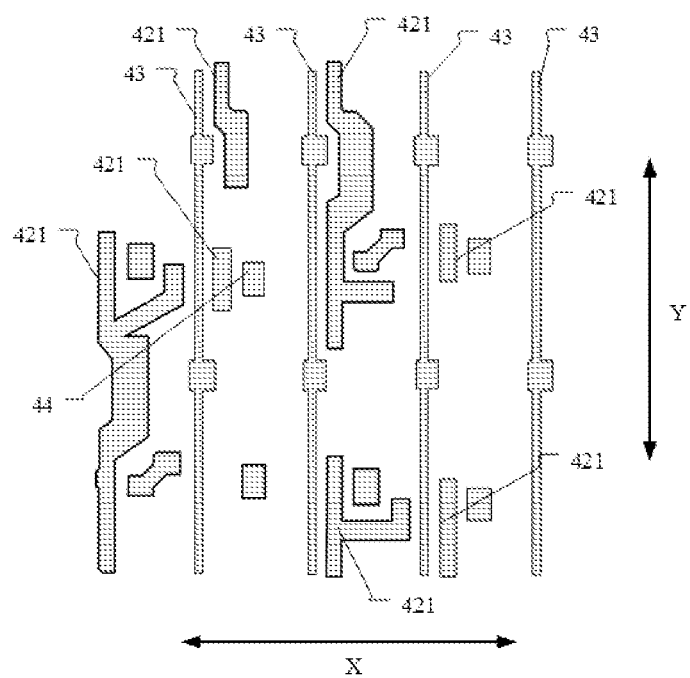
FIG. 17 is a structural layout of a fourth conductive layer in FIG. 12.
Figure 18:
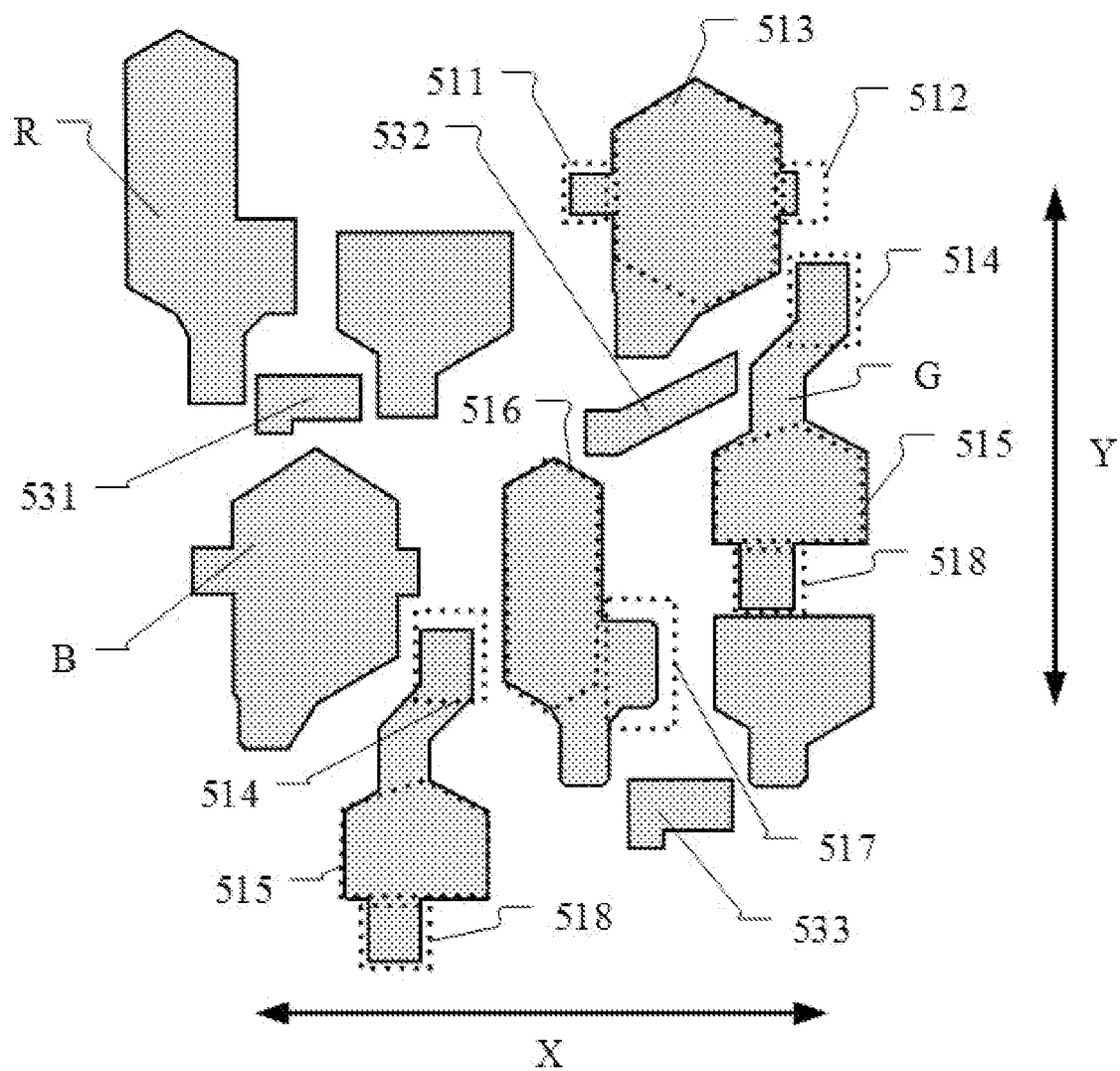
FIG. 18 is a structural layout of a fifth conductive layer in FIG. 12.
Figure 19:
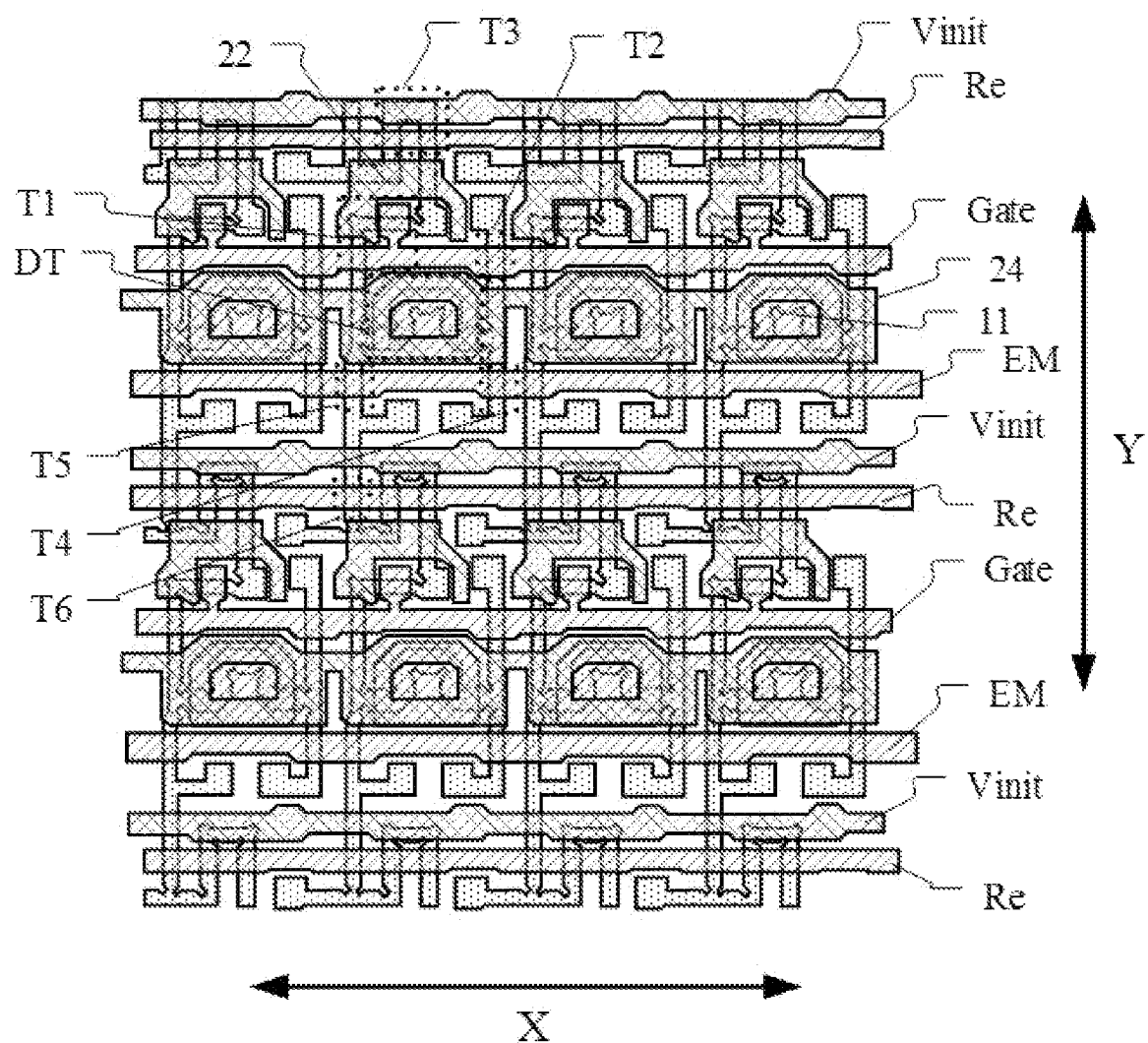
FIG. 19 is a structural layout of an active layer, the first conductive layer and the second conductive layer in FIG. 12.
Figure 20:
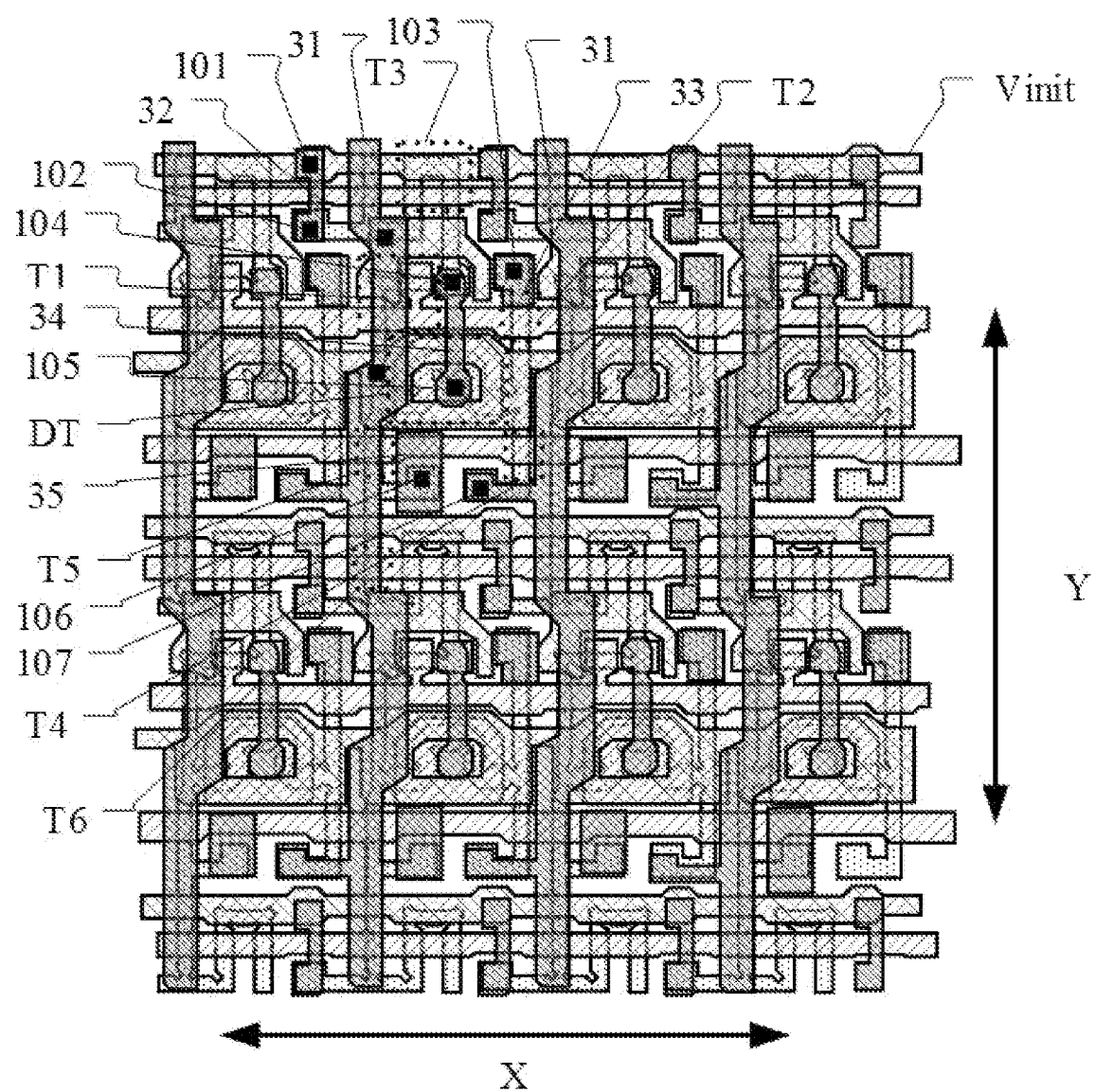
FIG. 20 is a structural layout of the active layer, the first conductive layer, the second conductive layer, and the third conductive layer in FIG. 12.
Figure 21:
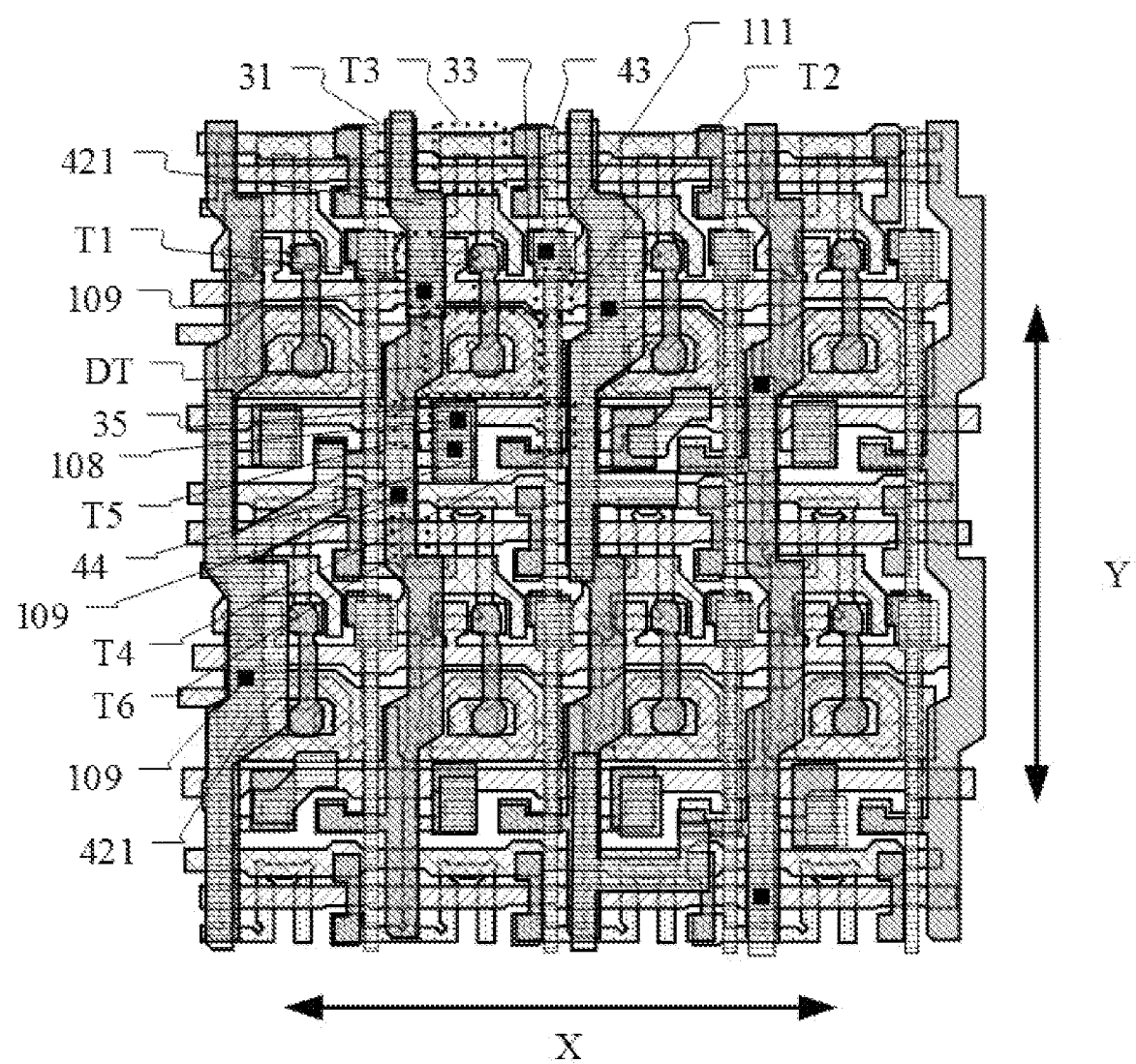
FIG. 21 is a structural layout of the active layer, the first conductive layer, the second conductive layer, the third conductive layer, and the fourth conductive layer in FIG. 12.

As shown in FIGS. 12-20, FIG. 12 is a structural layout of another exemplary embodiment of the display panel of the present disclosure, FIG. 13 is a structural layout of the active layer in FIG. 12, and FIG. 14 is a structural layout of the first conductive layer in FIG. 12, FIG. 15 is a structural layout of the second conductive layer in FIG. 12, FIG. 16 is a structural layout of the third conductive layer in FIG. 12, FIG. 17 is a structural layout of the fourth conductive layer in FIG. 12, and FIG. 18 is a structural layout of the fifth conductive layer in FIG. 12, FIG. 19 is a structural layout of the active layer, the first conductive layer and the second conductive layer in FIG. 12, and FIG. 20 is a structural layout of the active layer, the first conductive layer, the second conductive layer and the third conductive layer in FIG. 12, FIG. 21 is a structural layout of the active layer, the first conductive layer, the second conductive layer, the third conductive layer, and the fourth conductive layer in FIG. 12. The display panel may include the pixel driving circuit shown in FIG. 11. The display panel shown in FIG. 12 may include all the technical features of the display panels shown in FIGS. 3 and 7.

In this exemplary embodiment, the display panel may include a base substrate, an active layer, a first conductive layer, a second conductive layer, a third conductive layer, a fourth conductive layer, and a fifth conductive layer that are stacked in sequence. As shown in FIGS. 12, 13 and 19, the active layer may include a first active part 61, a second active part 62, a third active part 63, a fourth active part 64, a fifth active part 65, a sixth active part 66, a seventh active part 67, an eighth active part 68, a ninth active part 69, a tenth active part 610, an eleventh active part 611, a twelfth active part 612, a thirteenth active part 613, and a fourteenth active part 614. The first active part 61 can be used to form a first channel region of the first transistor T1, The second active part 62 can be used to form a second channel region of the first transistor T1. The third active part 63 may be connected between the first active part 61 and the second active part 62. The fourth active part 64 can be connected to the second active part 62 for connecting to the first electrode of the first transistor T1. The fifth active part 65 is configured to connect the second electrode of the second transistor T2. The orthographic projection of the fifth active part 65 on the base substrate and the orthographic projection of the fourth active part 64 on the base substrate are spaced apart in the second direction X. The sixth active part 66 is used to form the channel region of the drive transistor DT. The seventh active part 67 is used to form the channel region of the second transistor T2. The eighth active part 68 is used to form the channel region of the third transistor T3. The ninth active part 69 is used to form the channel region of the fifth transistor T5. The tenth active part 610 is used to form the channel region of the sixth transistor T6. The eleventh active part 611 is used to form the channel region of the fourth transistor T4.

As shown in FIGS. 12, 14 and 19, the first conductive layer may include a first grid line Gate, a second grid line Re, a third grid line EM, a first conductive part 11, and a sixth bump 12. The sixth bump 12 is connected to the first grid line Gate. The orthographic projections of the first grid line Gate, the second grid line Re, and the third grid line EM on the base substrate may extend in the second direction X. The first grid line Gate can be used to provide the gate driving signal terminal Gate in FIG. 11, the second grid line Re can be used to provide the reset signal terminal Re in FIG. 11, and the third grid line EM can be used to provide the enable signal terminal EM in FIG. 11. The orthographic projection of the first grid line Gate on the base substrate covers the orthographic projection of the first active part 61 on the base substrate, so that some of the structure of the first grid line is used to form the first gate of the first transistor T1. The orthographic projection of the sixth bump 12 on the base substrate covers the orthographic projection of the second active part 62 on the base substrate, so that the sixth bump 12 is used to form the second gate of the first transistor T1. The orthographic projection of the first grid line Gate on the base substrate covers the orthographic projection of the seventh active part 67 on the base substrate, so that part of the structure of the first grid line is used to form the gate of the second transistor T2. The orthographic projection of the first conductive part 11 on the base substrate covers the orthographic projection of the sixth active part 66 on the base substrate, so as to form the gate of the drive transistor DT and an electrode of the capacitor C in FIG. 11. The orthographic projection of the second grid line Re on the base substrate covers the orthographic projection of the eighth active part 68 on the base substrate, so that part of the structure of the second grid line Re is used to form the gate of the third transistor T3. The orthographic projection of the third grid line EM on the base substrate covers the orthographic projection of the ninth active part 69 on the base substrate, so that part of the structure of the third grid line EM is used to form the gate of the fifth transistor T5. The orthographic projection of the third grid line EM on the base substrate covers the orthographic projection of the eleventh active part 611 on the base substrate, so that part of the structure of the third grid line EM is used to form the gate of the fourth transistor T4. The orthographic projection of the second grid line Re in the pixel driving circuit in the next adjacent row on the base substrate covers the orthographic projection of the tenth active part 610 on the base substrate, so that the part of the structure of the second grid line Re can be used to form the gate of the sixth transistor T6.

As shown in FIGS. 12, 15 and 19, the second conductive layer may include a fourth grid line Vinit, a second conductive part 22, a third conductive part 23, and a fourth conductive part 24. The orthographic projection of the fourth grid line Vinit on the base substrate may extend in the second direction X, and is used to provide the initialization signal terminal Vinit in FIG. 11. There may be multiple third conductive parts 23 and multiple fourth conductive parts 24. The multiple third conductive parts 23 may be spaced apart in the second direction X. The multiple fourth conductive parts 24 may be distributed in the second direction X, and the multiple fourth conductive parts can be connected to each other, and the fourth conductive part 24 can be used to form another electrode of the capacitor C in FIG. 11.

As shown in FIGS. 12, 16 and 20, the third conductive layer may include a first signal line 31, a conductive part 32, a conductive part 33, a conductive part 34, and a conductive part 35. The orthographic projection of the first signal line 31 on the base substrate may extend in the first direction Y, and the first signal line 31 may be used to provide the first power supply terminal VDD in FIG. 11. The conductive part 32 can be connected to the fourth grid line Vinit through the via hole 101 and be connected to the fourteenth active part 614 through the via hole 102, to be connected to the first electrode of the third transistor T3 and the initial signal terminal Vinit. The conductive part 33 may be connected to the fifth active part 65 through the via hole 103, to be connected to the second electrode of the second transistor T2. The conductive part 34 may be connected to the fourth active part 64 through the via hole 104 and be connected to the first conductive part 11 through the via hole 105, so as to be connected the gate of the drive transistor DT and the first electrode of the first transistor T1. The conductive part 35 may be connected to the twelfth active part 612 through the via hole 106, to be connected to the second electrode of the fifth transistor T5. The first signal line 31 is also connected to the thirteenth active part 613 through the via hole 107, to be connected to the first power supply terminal VDD and the first electrode of the fourth transistor T4.

As shown in FIGS. 12, 17 and 21, the fourth conductive layer of the display panel may have the same structure as the fourth conductive layer in FIGS. 3 and 7. The fourth conductive layer may include a third signal line 43, the second signal line, and a conductive part 44. The orthographic projection of the third signal line 43 on the base substrate may extend in the first direction Y, and the third signal line 43 may be used to provide the data signal terminal Da in FIG. 11. The second signal line may be arranged in a one-to-one correspondence with the first signal line 31. The second signal line may include a plurality of second signal line segments 421 spaced apart in the first direction Y. The second signal line segment 421 may be electrically connected to a corresponding first signal line 31 through the via hole 109. The conductive part 44 may be electrically connected to the conductive part 35 through the via hole 108, to be connected to the second electrode of the fifth transistor T5. The third signal line 43 may be connected to the conductive part 33 through the via hole 111, to be connected to the second electrode of the second transistor T2.

As shown in FIGS. 12 and 18, the fifth conductive part may include a plurality of R-electrode parts R, a plurality of G-electrode parts G, and a plurality of B-electrode parts B, and the electrode part may be connected to the conductive part 44 through the via hole 110, to be connected to the second electrode of the fifth transistor T5.

It should be understood that, in other exemplary embodiments, the pixel driving circuit in the display panel may also have other structures.

In this exemplary embodiment, as shown in FIGS. 13, 15 and 19, the first transistor T1 is a double gate structure, the third active part 63 is a conductor. The third active part 63 and the first grid line Gate may form a capacitor structure. A voltage fluctuation is easily occurred on the third active part 63 due to the voltage of the first grid line Gate, thereby causing the third active part 63 to leak current to the source and drain of the first transistor T1. In this exemplary embodiment, as shown in FIG. 19, the orthographic projection of the second conductive part 22 on the base substrate may be located at a side of the orthographic projection of the first grid line Gate on the base substrate away from the orthographic projection of the first conductive part 11 on the base substrate. The orthographic projection of the second conductive part 22 on the base substrate may at least partially overlap with the orthographic projection of the third active part 63 on the base substrate. Since the second conductive part 22 is connected to the first signal line 31 with a stable voltage, the third active part 63 can reduce its voltage fluctuation under the coupling action of the second conductive part 22.

In this exemplary embodiment, as shown in FIGS. 13, 15 and 19, the orthographic projection of the second conductive part 22 on the base substrate may also partially overlap with the orthographic projection of the fourth active part 64 on the base substrate. Similarly, the second conductive part 22 and the fourth active part 64 can form a parallel plate capacitor, and the fourth active pan 64 can reduce its voltage fluctuation under the coupling action of the second conductive part 22, so as to ensure that the voltage of the node N in FIG. 11 of the light emitting unit is stable during the light emitting stage.

In this exemplary embodiment, as shown in FIG. 19, the orthographic projection of the third conductive part 23 on the base substrate may be located between the orthographic projection of the fifth active part 65 on the base substrate and the orthographic projection of the fourth active part 65 on the base substrate. The third conductive part 23 and the fourth active part 64 can form a lateral capacitor, and the fourth active part 64 can reduce its voltage fluctuation under the coupling action of the third conductive part 23, thereby ensuring that the voltage of node N in FIG. 11 in the light emitting unit is stable during the light emitting stage.

In this exemplary embodiment, the display panel shown in FIGS. 12 and 18 includes a pixel driving circuit 81 and a pixel driving circuit 82 arranged to be adjacent in the second direction. The display panel further includes a light emitting layer arranged on a side of the fifth conductive layer away from the base substrate. The light emitting layer includes a plurality of light emitting parts 71, and the light emitting parts 71 are arranged in a one-to-one correspondence with the electrode parts. The light emitting part 71 may be formed in an opening of a pixel definition layer. The B-electrode part may include a B-electrode body 513, a first hump 511, and a second bump 512. The orthographic projection of the B-electrode body 513 on the base substrate completely coincides with the orthographic projection of a corresponding light emitting part 71 on the base substrate. The first bump 511 may be connected to the B-electrode body 513, and the orthographic projection of the first bump 511 on the base substrate may at least partially overlap with the orthographic projection of the sixth bump 12 in the pixel driving circuit 81 on the base substrate. Since the voltage of the electrode part is stable in the light emitting stage of the pixel driving circuit, such arrangement can stabilize the sixth bump 12 (the gate of the first transistor) through the first bump 511, so as to prevent the node N from leaking current through the first transistor T1 at the light emitting node. The second bump 512 may be connected to the B-electrode body 513, and the orthographic projection of the second bump 512 on the base substrate may at least partially overlap with the orthographic projection of the sixth bump 12 in the pixel driving circuit on the base substrate. Likewise, such arrangement can stabilize the sixth bump 12 (gate of the first transistor) through the first bump 511, so as to prevent the node N from leaking current through the first transistor T1 at the light emitting node.

In this exemplary embodiment, as shown in FIGS. 12 and 18, the R-electrode part R may include an R-electrode body 516 and a third bump 517. The orthographic projection of the R-electrode body 516 on the base substrate can completely coincide with the orthographic projection of a corresponding light emitting part on the base substrate. The third bump 517 is connected to the R-electrode body 516, and the orthographic projection of the third bump 517 on the base substrate may at least partially overlap with the orthographic projection of the first conductive part 11 on the base substrate. Such arrangement can stabilize the voltage of the first conductive part 11 through the third bump 517, so as to reduce the voltage fluctuation of the node N in the pixel driving circuit during the light emitting stage. The orthographic projection of the third bump 517 on the base substrate may at least partially overlap with the orthographic projection of an opening 241 on the base substrate.

In this exemplary embodiment, as shown in FIGS. 12 and 18, the display panel may include a pixel driving circuit 82 and a pixel driving circuit 84 which are arranged adjacent to each other in the first direction Y. Some G-electrode parts G may include a G-electrode body 515, a fourth bump 514, and a fifth bump 518. The orthographic projection of the G-electrode body 515 on the base substrate may completely coincide with the orthographic projection of a corresponding light emitting part 71 on the base substrate, and the orthographic projection of the G-electrode body 515 on the base substrate may not intersect with the orthographic projection of the first conductive part 11 on the base substrate. The fourth bump 514 can be connected to the G-electrode body 515, and the orthographic projection of the fourth bump 514 on the base substrate can at least partially overlap with the orthographic projection of the first conductive part 11 in the pixel driving circuit 82 on the base substrate. Such arrangement can stabilize the voltage on the first conductive part 11 through the fourth bump 514 in the light emitting stage. The fifth bump 518 may be connected to the G-electrode body 515, and the orthographic projection of the fifth bump 518 on the base substrate may at least partially overlap with the orthographic projection of the sixth bump 12 in the pixel driving circuit 84 on the base substrate. Such arrangement can stabilize the voltage on the sixth bump 12 through the fifth bump 518 in the light emitting stage.

Figure 22:
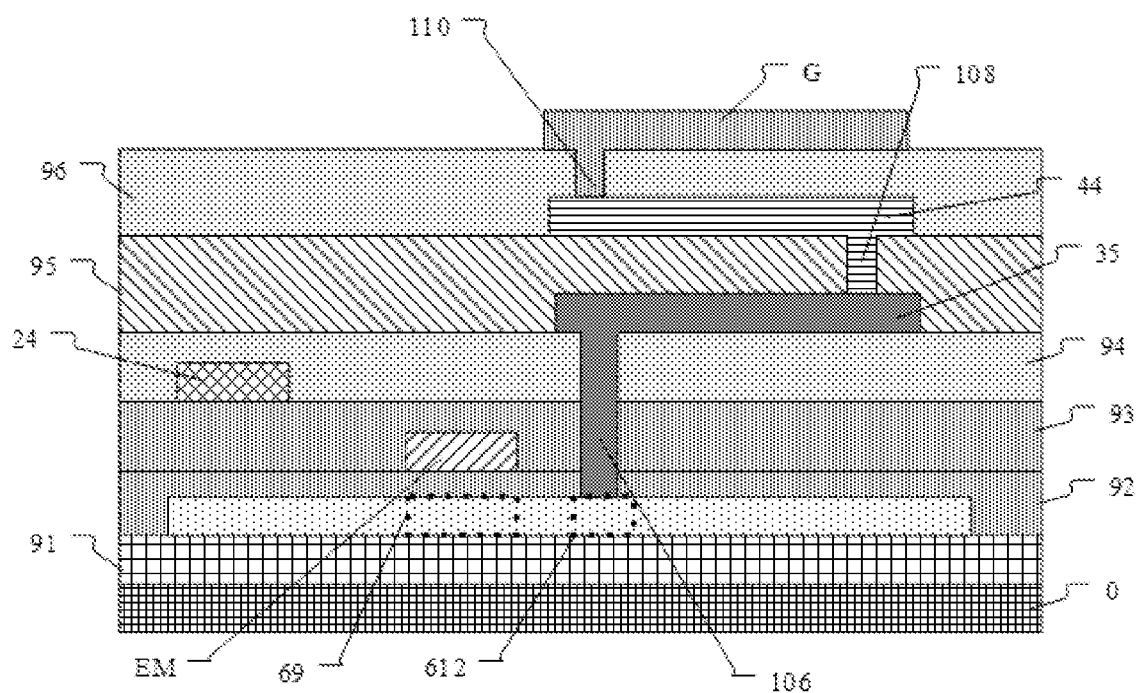
FIG. 22 is a partial cross-sectional view taken along the dotted line C in FIG. 12.

FIG. 22 is a partial cross-sectional view taken along the dotted line C in FIG. 12. The display panel may further include a buffer layer 91, a first gate insulating layer 92, a second gate insulating layer 93, a dielectric layer 94, a first flat layer 95, and a second flat layer 96. The base substrate 0, the buffer layer 91, the active layer, the first gate insulating layer 92, the first conductive layer, the second gate insulating layer 93, the second conductive layer, the dielectric layer 94, the third conductive layer, the first flat layer 95, the fourth conductive layer, the second flat layer 96, and the fifth conductive layer are stacked in sequence. The gate insulating layer may be a silicon oxide layer, and the dielectric layer may be a silicon nitride layer. The material of the buffer layer can be silicon nitride or silicon oxide. The material of the active layer may be polysilicon, metal oxide semiconductor, or the like. The first conductive layer, the second conductive layer, the third conductive layer, and the fourth conductive layer can all be formed by at least one metal layer. For example, the first conductive layer, the second conductive layer, the third conductive layer, and the fourth conductive layer can all be formed by stacking a first titanium layer, an aluminum layer, and a second titanium layer in sequence. The base substrate may be formed from an insulating material. For example, the base substrate may include a first polyimide (PI) layer, a first silicon oxide (SiO) layer, an amorphous silicon layer, and a second polyimide (PI) layer and a second silicon oxide layer, which are sequentially arranged.

The present exemplary embodiment also provides a display device including the above-mentioned display panel. The display device may be a mobile phone, a tablet computer, or the like.

Other embodiments of the present disclosure will be apparent to those skilled in the art from consideration of the specification and practice of the present disclosure disclosed herein. The present application is intended to cover any variations, uses, or adaptations of the present disclosure, which are in accordance with the general principles of the present disclosure and include common general knowledge or conventional technical means in the art that are not disclosed in the present disclosure. The specification and embodiments are illustrative, and the real scope and spirit of the present disclosure is defined by the appended claims.

It should be understood that the present disclosure is not limited to the precise structures that have been described above and shown in the drawings, and various modifications and changes can be made without departing from the scope thereof. The scope of the present disclosure is merely defined by the appended claims.

What is claimed is:

1. A display panel, comprising:
   a base substrate;
   a third conductive layer, wherein the third conductive layer is arranged on a side of the base substrate, and comprises a plurality of first signal lines, wherein orthographic projections of the plurality of first signal lines on the base substrate extend in a first direction and are spaced apart in a second direction, the first direction intersects with the second direction;
   a fourth conductive layer, wherein the fourth conductive layer is arranged on a side of the third conductive layer away from the base substrate, and the fourth conductive layer comprises a plurality of second signal lines, wherein orthographic projections of the plurality of the second signal lines on the base substrate extend in the first direction and are spaced apart in the second direction; wherein the plurality of the second signal lines are arranged in a one-to-one correspondence with the plurality of the first signal lines, each of the second signal lines comprises a plurality of second signal line segments, and orthographic projections, on the base substrate, of the plurality of the second signal line segments belonging to the same second signal line are spaced apart in the first direction, and the orthographic projection of the second signal line segment on the base substrate extends in the first direction; wherein the orthographic projection of each of the second signal line segments on the base substrate at least partially overlaps with the orthographic projection of a corresponding first signal line on the base substrate, and each of the second signal line segments and the corresponding first signal line are electrically connected through a via hole; and a fifth conductive layer, wherein the fifth conductive layer is arranged on a side of the fourth conductive layer away from the base substrate, and the fifth conductive layer comprises a plurality of electrode parts, wherein each of the electrode parts is configured to form an electrode of a light emitting unit;

wherein orthographic projections, on the base substrate, of at least some electrode parts among the plurality of electrode parts are partially located in a gap between the orthographic projections, on the base substrate, of adjacent two second signal line segments in the same second signal line; and at least some of adjacent two first signal lines are electrically connected.

2. The display panel according to claim 1, wherein the first signal lines and the second signal lines are configured to provide power signals.

3. The display panel according to claim 2, wherein:
the fourth conductive layer further comprises: a plurality of third signal lines, wherein an orthographic projection of the third signal line on the base substrate is located between the orthographic projections of adjacent two second signal lines on the base substrate; and
the fifth conductive layer further comprises at least one connection part, and the at least one connection part is configured to connect adjacent two second signal lines through a via hole respectively, so as to connect adjacent two first signal lines.

4. The display panel according to claim 3, wherein:
the first direction is a column direction, and the second direction is a row direction;
the plurality of electrode parts comprise R-electrode parts, G-electrode parts, and B-electrode parts, wherein the R-electrode parts, the G-electrode parts, and the B-electrode parts are alternately distributed in sequence along a same electrode row; and
in the same electrode row, two G-electrode parts distributed along the column direction are arranged between the R-electrode part and the B-electrode part; in adjacent two electrode rows, the electrode parts for the same color are arranged in different columns; and in two electrode rows separated by one electrode row, the electrode parts for the same color are arranged in the same column.

5. The display panel according to claim 4, wherein the plurality of second signal lines comprise:
a first power line, comprising a plurality of first power line segments spaced apart in the first direction;
a second power line, arranged to be adjacent to the first power line, wherein the second power line comprises a plurality of second power line segments and a plurality of third power line segments spaced apart in the first direction, and the second power line segments and the third power line segments are alternately distributed in sequence in the first direction;

a third power line, arranged to be adjacent to the second power line, and the third power line comprises a plurality of fourth power line segments spaced apart in the first direction; and a fourth power line, arranged to be adjacent to the third power line, and the fourth power line comprises a plurality of fifth power line segments and a plurality of sixth power line segments spaced apart in the first direction, and the fifth power line segments and the sixth power line segments are alternately distributed in sequence in the first direction;

wherein any one of the first power line, the second power line, the third power line and the fourth power line is configured to form the second signal line, and any one of the first power line segments, the second power line segments, the third power line segments, the fourth power line segments, the fifth power line segments, and the sixth power line segments is configured to form the second signal line segment;

wherein the at least one connection part comprises a plurality of connection parts, and the connection parts comprise: a plurality of first connection parts, a plurality of second connection parts, and a plurality of third connection parts, the first power line segment is connected to the third power line segment through the first connection part, the fourth power line segment is connected to the fifth power line segment through the second connection part, and the fourth power line segment is connected to the sixth power line segment through the third connection part.

6. The display panel according to claim 5, wherein:
the R-electrode parts comprise: a plurality of first R-electrode parts arranged in the same electrode column; and a plurality of second R-electrode parts arranged in the same electrode column;
the B-electrode parts comprise: a plurality of first B-electrode parts arranged in the same electrode column; and a plurality of second B-electrode parts arranged in the same electrode column;
the G-electrode parts comprise: a plurality of first G-electrode parts arranged in the same electrode column; and a plurality of second G-electrode parts arranged in the same electrode column;
an electrode column where the first R-electrode parts are located, an electrode column where the first B-electrode parts are located, an electrode column where the first G-electrode parts are located, an electrode column where the second R-electrode parts are located, an electrode column where the second B-electrode parts are located and an electrode column where the second G-electrode parts are located, are distributed in sequence in the second direction;
the orthographic projection of the first R-electrode part on the base substrate is located in a gap between the orthographic projections of adjacent two first power line segments on the base substrate, wherein the adjacent two first power line segments are located in the same first power line;
the orthographic projection of the first B-electrode part on the base substrate is partially located in a gap between the orthographic projections, on the base substrate, of the second power line segment and the third power line segment adjacent to each other, wherein the second power line segment and the third power line segment adjacent to each other are located in the same second power line;

the orthographic projection of the first G-electrode part on the base substrate is partially located in a gap between the orthographic projections, on the base substrate, of the second power line segment and the third power line segment adjacent to each other, wherein the second power line segment and the third power line segment adjacent to each other are located in the same second power line;

the orthographic projection of the second R-electrode part on the base substrate is partially located in a gap between the orthographic projections of adjacent two fourth power line segments on the base substrate, and the adjacent two fourth power line segments are located in the same third power line;

the orthographic projection of the second B-electrode part on the base substrate is located in a gap between the orthographic projections, on the base substrate of the fifth power line segment and the sixth power line segment adjacent to each other, and the fifth power line segment and the sixth power line segment adjacent to each other are located in the same fourth power line; and the orthographic projection of the second G-electrode part on the base substrate is located in a gap between the orthographic projections, on the base substrate, of the fifth power line segment and the sixth power line segment adjacent to each other, and the fifth power line segment and the sixth power line segment adjacent to each other are located in the same fourth power line.

7. The display panel according to claim 5, wherein the fourth conductive layer further comprises:

a first extension part connected to the first power line segment, in the second direction, the orthographic projection of the first extension part on the base substrate is located between the orthographic projection of the first power line segment on the base substrate and the orthographic projection of the third power line segment on the base substrate, and the first extension part is connected to the third power line segment through the first connection part;

a second extension part connected to the fourth power line segment, in the second direction, the orthographic projection of the second extension part on the base substrate is located between the orthographic projection of the fourth power line segment on the base substrate and the orthographic projection of the fifth power line segment on the base substrate, and the second extension part is connected to the fifth power line segment through the second connection part; and a third extension part connected to the fourth power line segment, in the second direction, the orthographic projection of the third extension part on the base substrate is located between the orthographic projection of the fourth power line segment on the base substrate and the orthographic projection of the sixth power line segment on the base substrate, and the third extension part is connected to the sixth power line segment through the third connection part.

8. The display panel according to claim 6, wherein:

the orthographic projection of the third power line segment on the base substrate is located between the orthographic projections of adjacent two first G-electrode parts on the base substrate, and the adjacent two first G-electrode parts are located in the same electrode column, and are located in different electrode rows;

the orthographic projection of the fifth power line segment on the base substrate is located between the orthographic projections of adjacent two second G-electrode parts on the base substrate, and the adjacent two second G-electrode parts are located in the same electrode column, and are located in different electrode rows; and the orthographic projection of the sixth power line segment on the base substrate is located between the orthographic projections of adjacent two second G-electrode parts on the base substrate, and the adjacent two second G-electrode parts are located in the same electrode column, and are located in different electrode rows.

9. The display panel according to claim 1, wherein the second signal line segment is connected to a corresponding first signal line through a plurality of via holes.

10. The display panel according to claim 4, further comprising a pixel driving circuit, the pixel driving circuit comprises a drive transistor and a first transistor, wherein a first electrode of the first transistor is connected to a gate of the drive transistor, and a second electrode of the first transistor is connected to a first electrode of the drive transistor, wherein the display panel further comprises:

an active layer, arranged between the base substrate and the third conductive layer, wherein the active layer comprises:
  a first active part, configured to form a first channel region of the first transistor;
  a second active part, configured to form a second channel region of the first transistor; and
  a third active part, connected between the first active part and the second active part;

a first conductive layer, arranged between the active layer and the third conductive layer, wherein the first conductive layer comprises:
  a first conductive part, configured to form the gate of the drive transistor; and
  a first grid line, wherein the orthographic projection of the first grid line on the base substrate covers the first active part, and a part of the first grid line is configured to form a first gate of the first transistor;

a second conductive layer, arranged between the first conductive layer and the third conductive layer, and the second conductive layer comprises:
  a second conductive part, wherein the second conductive part is connected to the first signal line through a via hole, and the orthographic projection of the second conductive part on the base substrate at least partially overlaps with the orthographic projection of the third active part on the base substrate, and the orthographic projection of the second conductive part on the base substrate is located at a side of the orthographic projection of the first grid line on the base substrate away from the orthographic projection of the first conductive part on the base substrate.

11. The display panel according to claim 10, wherein the active layer further comprises a fourth active part, the fourth active part is connected to the second active part, so as to be connected to the first electrode of the first transistor;

wherein the orthographic projection of the second conductive part on the base substrate at least partially overlaps with the orthographic projection of the fourth active part on the base substrate.

12. The display panel according to claim 11, wherein the pixel driving circuit further comprises a second transistor, a first electrode of the second transistor is connected to the second electrode of the drive transistor, and a second electrode of the second transistor is configured to receive a data signal, wherein the active layer further comprises:
- a fifth active part, configured to be connected to the second electrode of the second transistor, the orthographic projection of the fifth active part on the base substrate and the orthographic projection of the fourth active part on the base substrate are spaced apart in the second direction;
- wherein the second conductive layer further comprises: a third conductive part, connected to the second conductive part, wherein the orthographic projection of the third conductive part on the base substrate is located between the orthographic projection of the fifth active part on the base substrate and the orthographic projections of the fourth active part on the base substrate.

13. The display panel according to claim 10, wherein the display panel comprises a first pixel driving circuit and a second pixel driving circuit arranged to be adjacent in the second direction, wherein the first conductive layer further comprises:
- a sixth bump, wherein the sixth bump is connected to the first grid line, the orthographic projection of the sixth bump on the base substrate covers the second active part, and the sixth bump is configured to form a second gate of the first transistor;

wherein the display panel further comprises:
- a light emitting layer, arranged on a side of the fifth conductive layer away from the base substrate, wherein the light emitting layer comprises a plurality of light emitting parts, and the light emitting parts are arranged in a one-to-one correspondence with the electrode parts;

wherein the B-electrode part comprises:
- a B-electrode body, wherein the orthographic projection of the B-electrode body on the base substrate completely coincides with the orthographic projection of a corresponding light emitting part on the base substrate;
- a first bump, wherein the first bump is connected to the B-electrode body, and the orthographic projection of the first bump on the base substrate at least partially overlaps with the orthographic projection of the sixth bump in the first pixel driving circuit on the base substrate; and
- a second bump, wherein the second bump is connected to the B-electrode body, and the orthographic projection of the second bump on the base substrate at least partially overlaps with the orthographic projection of the sixth bump in the second pixel driving circuit on the base substrate.

14. The display panel according to claim 10, further comprising:
- a light emitting layer, arranged on a side of the fifth conductive layer away from the base substrate, wherein the light emitting layer comprises a plurality of light emitting parts, and the light emitting parts are arranged in a one-to-one correspondence with the electrode parts;

wherein the R-electrode part comprises:
- a R-electrode body, wherein the orthographic projection of the R-electrode body on the base substrate completely coincides with the orthographic projection of a corresponding light emitting part on the base substrate; and
- a third bump, wherein the third bump is connected to the R-electrode body, and the orthographic projection of the third bump on the base substrate at least partially overlaps with the orthographic projection of the first conductive part on the base substrate.

15. The display panel according to claim 10, wherein the display panel comprises a third pixel driving circuit and a fourth pixel driving circuit arranged to be adjacent in the first direction,
wherein the first conductive layer further comprises:
- a sixth bump, wherein the sixth bump is connected to the first grid line, the orthographic projection of the sixth bump on the base substrate covers the second active part, and the sixth bump is configured to form a second gate of the first transistor;

wherein the display panel further comprises:
- a light emitting layer, arranged on a side of the fifth conductive layer away from the base substrate, wherein the light emitting layer comprises a plurality of light emitting parts, and the light emitting parts are arranged in a one-to-one correspondence with the electrode parts;

wherein some of the G-electrode parts comprises:
- a G-electrode body, wherein the orthographic projection of the G-electrode body on the base substrate completely coincides with the orthographic projection of a corresponding light emitting part on the base substrate;
- a fourth bump, wherein the fourth bump is connected to the G-electrode body, and the orthographic projection of the fourth bump on the base substrate at least partially overlaps with the orthographic projection of the first conductive part in the third pixel driving circuit on the base substrate; and
- a fifth bump, wherein the fifth bump is connected to the G-electrode body, and the orthographic projection of the fifth bump on the base substrate at least partially overlaps with the orthographic projection of the sixth bump in the fourth pixel driving circuit on the base substrate.

16. A display device comprising a display panel, wherein the display panel comprises:
- a base substrate;
- a third conductive layer, wherein the third conductive layer is arranged on a side of the base substrate, and comprises a plurality of first signal lines, wherein orthographic projections of the plurality of first signal lines on the base substrate extend in a first direction and are spaced apart in a second direction, the first direction intersects with the second direction;
- a fourth conductive layer, wherein the fourth conductive layer is arranged on a side of the third conductive layer away from the base substrate, and the fourth conductive layer comprises a plurality of second signal lines, wherein orthographic projections of the plurality of the second signal lines on the base substrate extend in the first direction and are spaced apart in the second direction; wherein the plurality of the second signal lines are arranged in a one-to-one correspondence with the plurality of the first signal lines, each of the second signal lines comprises a plurality of second signal line segments, and orthographic projections, on the base substrate, of the plurality of the second signal line segments belonging to the same second signal line are spaced apart in the first direction, and the orthographic projection of the second signal line segment on the base substrate extends in the first direction; wherein the orthographic projection of each of the second signal line segments on the base substrate at least partially overlaps with the orthographic projection of a corresponding first signal line on the base substrate, and each of the second signal line segments and the corresponding first signal line are electrically connected through a via hole; and a fifth conductive layer, wherein the fifth conductive layer is arranged on a side of the fourth conductive layer away from the base substrate, and the fifth conductive layer comprises a plurality of electrode parts, wherein each of the electrode parts is configured to form an electrode of a light emitting unit;

wherein orthographic projections, on the base substrate, of at least some electrode parts among the plurality of electrode parts are partially located in a gap between the orthographic projections, on the base substrate, of adjacent two second signal line segments in the same second signal line; and at least some of adjacent two first signal lines are electrically connected.

17. The display device according to claim 16, wherein the first signal lines and the second signal lines are configured to provide power signals.

18. The display device according to claim 17, wherein:
the fourth conductive layer further comprises: a plurality of third signal lines, wherein an orthographic projection of the third signal line on the base substrate is located between the orthographic projections of adjacent two second signal lines on the base substrate; and the fifth conductive layer further comprises at least one connection part, and the at least one connection part is configured to connect adjacent two second signal lines through a via hole respectively, so as to connect adjacent two first signal lines.

* * * * *